US007084847B2

(12) United States Patent
Kageyama et al.

(10) Patent No.: US 7,084,847 B2
(45) Date of Patent: Aug. 1, 2006

(54) IMAGE DISPLAY APPARATUS AND DRIVING METHOD THEREOF

(75) Inventors: Hiroshi Kageyama, Kokubunji (JP); Hajime Akimoto, Ome (JP); Yoshiro Mikami, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 537 days.

(21) Appl. No.: 09/932,113

(22) Filed: Aug. 20, 2001

(65) Prior Publication Data
US 2003/0001870 A1   Jan. 2, 2003

(30) Foreign Application Priority Data
Jun. 18, 2001   (JP)   ............................. 2001-183615

(51) Int. Cl.
G09G 3/36 (2006.01)
(52) U.S. Cl. ........................... 345/92; 345/100; 345/98
(58) Field of Classification Search ................... 345/92, 345/76, 98, 100
See application file for complete search history.

(56) References Cited

U.S. PATENT DOCUMENTS

| 5,574,475 | A   | * | 11/1996 | Callahan et al. | ............. 345/100 |
| 5,604,510 | A   | * | 2/1997  | Blanchard       | ..................... 345/98 |
| 6,028,580 | A   | * | 2/2000  | Kosegawa et al. | ............. 345/98 |
| 6,307,322 | B1  | * | 10/2001 | Dawson et al.   | ........... 315/169.1 |
| 6,504,522 | B1  | * | 1/2003  | Shiraki et al.  | ................ 345/98 |
| 6,535,189 | B1  |   | 3/2003  | Akiyama et al.  | |
| 6,549,184 | B1  | * | 4/2003  | Koyama et al.   | ............. 345/92 |
| 2001/0048408 | A1 | * | 12/2001 | Koyama et al. | ............. 345/76 |

FOREIGN PATENT DOCUMENTS

| JP | 06-161388   | 6/1994 |
| JP | 2001-034234 | 2/2001 |

OTHER PUBLICATIONS

"Extended Abstracts of the 1997 International Conference on Solid State Devices and Materials", 1997, pp. 348-349 Low-Temperature Poly-Si TFT-LCDs with Digital Interface, by Jun Koyama, et al.

* cited by examiner

Primary Examiner—Bipin Shalwala
Assistant Examiner—Leonid Shapiro
(74) Attorney, Agent, or Firm—Antonelli, Terry, Stout and Kraus, LLP.

(57) ABSTRACT

The output lines are connected to the signal lines. The gradation voltage lines are arranged to intersect the output lines. Two switch drive lines are provided for one gradation voltage line. The trigger lines are provided in parallel with the output lines. The switch circuits are provided near the intersections at which those wiring lines intersect each other. The decoder to which the multi-tone image data is fed produces data of "1" on one single switch drive line, and data of "0" on the other switch drive lines. The trigger pulses are sequentially supplied to the trigger lines. Data of "1" is stored in the switch circuit connected to the switch drive line of "1". The gradation voltages from the gradation voltage lines connected to the switch circuit in which data of "1" is stored are supplied via the output lines to the signal lines.

16 Claims, 24 Drawing Sheets

1: INSULATING SUBSTRATE
2: SHIFT REGISTER
3: DECODER
4: DA CONVERTER
5: SCANNING CIRCUIT
6: DISPLAY REGION
7: PIXEL TFT
8: PIXEL
SW: SWITCH CIRCUIT

FIG.6

| in | out-1 | out-2 | out-3 | out-4 | out-5 | ..... | out-n |
|---|---|---|---|---|---|---|---|
| 1 | 1 | 0 | 0 | 0 | 0 | ..... | 0 |
| 2 | 0 | 1 | 0 | 0 | 0 | ..... | 0 |
| 3 | 0 | 0 | 1 | 0 | 0 | ..... | 0 |
| 4 | 0 | 0 | 0 | 1 | 0 | ..... | 0 |
| 5 | 0 | 0 | 0 | 0 | 1 | ..... | 0 |
| ⋮ | ⋮ | ⋮ | ⋮ | ⋮ | ⋮ | ⋱ | ⋮ |
| n | 0 | 0 | 0 | 0 | 0 | ..... | 1 |

INVERTER

CLOCKED INVERTER

AND GATE

FIG.16

| | in | out-1 | out-2 | out-3 | ..... | out-n | out-(n/2+1) | ..... | out-(n-2) | out-(n-1) | out-n |
|---|---|---|---|---|---|---|---|---|---|---|---|
| Odd | 1 | 1 | 0 | 0 | ..... | 0 | | | | | |
| | 2 | 0 | 1 | 0 | ..... | 0 | | | All 0 | | |
| | 3 | 0 | 0 | 1 | ..... | 0 | | | | | |
| | ⋮ | ⋮ | ⋮ | ⋮ | ⋱ | ⋮ | | | | | |
| | n/2 | 0 | 0 | 0 | ..... | 1 | | | | | |
| Even | 1 | | | | | | 0 | ..... | 0 | 0 | 1 |
| | 2 | | | | | | 0 | ..... | 0 | 1 | 0 |
| | 3 | | | All 0 | | | 0 | ..... | 1 | 0 | 0 |
| | ⋮ | | | | | | ⋮ | ⋰ | ⋮ | ⋮ | ⋮ |
| | n/2 | | | | | | 1 | ..... | 0 | 0 | 0 |

FIG.19

| | in | out-1 | out-2 | out-3 | out-4 | out-5 | out-6 | out-7 | out-8 | out-9 | out-10 | out-11 | out-12 |
|---|---|---|---|---|---|---|---|---|---|---|---|---|---|
| Odd | 1 | 1 | 0 | 0 | 0 | 0 | 0 | 0 | 0 | 0 | 0 | 0 | 0 |
| | 2 | 0 | 0 | 0 | 0 | 1 | 0 | 0 | 0 | 0 | 0 | 0 | 0 |
| | 3 | 0 | 0 | 0 | 0 | 0 | 0 | 1 | 0 | 0 | 0 | 0 | 0 |
| | 4 | 0 | 0 | 0 | 0 | 0 | 0 | 0 | 1 | 0 | 0 | 0 | 0 |
| | 5 | 0 | 0 | 0 | 0 | 0 | 0 | 0 | 0 | 1 | 0 | 0 | 0 |
| | 6 | 0 | 0 | 0 | 0 | 0 | 0 | 0 | 0 | 0 | 1 | 0 | 0 |
| | 7 | 0 | 0 | 0 | 0 | 0 | 0 | 0 | 0 | 0 | 0 | 1 | 0 |
| | 8 | 0 | 0 | 0 | 0 | 0 | 0 | 0 | 0 | 0 | 0 | 0 | 1 |
| Even | 1 | 0 | 0 | 0 | 0 | 0 | 0 | 0 | 0 | 0 | 0 | 0 | 1 |
| | 2 | 0 | 0 | 0 | 0 | 0 | 0 | 0 | 1 | 0 | 0 | 0 | 0 |
| | 3 | 0 | 0 | 0 | 0 | 0 | 1 | 0 | 0 | 0 | 0 | 0 | 0 |
| | 4 | 0 | 0 | 0 | 0 | 1 | 0 | 0 | 0 | 0 | 0 | 0 | 0 |
| | 5 | 0 | 0 | 0 | 1 | 0 | 0 | 0 | 0 | 0 | 0 | 0 | 0 |
| | 6 | 0 | 0 | 1 | 0 | 0 | 0 | 0 | 0 | 0 | 0 | 0 | 0 |
| | 7 | 0 | 1 | 0 | 0 | 0 | 0 | 0 | 0 | 0 | 0 | 0 | 0 |
| | 8 | 1 | 0 | 0 | 0 | 0 | 0 | 0 | 0 | 0 | 0 | 0 | 0 |

IMAGE DISPLAY APPARATUS AND DRIVING METHOD THEREOF

BACKGROUND OF THE INVENTION

The present invention relates to an image display apparatus and a driving method thereof, and particularly to an image display apparatus and a driving method thereof which are suitable for displaying an image according to a multi-tone digital signal.

Conventionally, there is known the following image display apparatus. A plurality of signal lines and a plurality of scanning lines are arranged in a matrix shape in a display region for displaying an image. The pixels connected to the signal lines and the scanning lines through the switch elements are provided in the respective regions near the intersections of the signal lines and the scanning lines. The scanning circuit for driving the scanning lines and the driving circuit for driving the signal lines are provided in the non-display region. The driving circuit is constructed to receive a six-bit 64-gradation digital signal and to generate a 64-gradation voltage according to this digital signal as disclosed in Extended Abstracts of the 1997 International Conference on Solid State Devices and Materials, pp.348-349, FIG. 2n, for example.

More specifically, this driving circuit includes a shift register, a data bus, two latches, and a DA converter circuit. That is, the data bus for transferring the six-bit binary data is provided between the shift register and one of the latches, which is connected to the data bus. In this case, the latch for driving one signal line has six signal paths which have their input sides connected to the respective lines of the data bus. In other words, the data bus and the one latch are connected through six lines. The 6-bit binary data fed on the six lines of the data bus are stored in the one latch in response to the latch pulse produced from the shift register. After the latch is all filled with the data, the data stored in the one latch is transferred in response to the latch pulse to the other latch, where it is stored. The data stored in the other latch is held until data is again latched. The data stored in the other latch is converted in the DA converter into one of the 64 different gradation voltages. The converted gradation voltage is produced on the signal line.

When the driving circuit is incorporated in the image display apparatus, the increase of the display gradation number of the image display apparatus (namely, the bit number of data) will result in the expansion of the region in which the driving circuit is formed in accordance with the increase of the number of the data lines. The increase of the region in which the driving circuit is formed in accordance with the increase of the display gradation number, however, results in the expansion of the non-display region. Thus, the area in which the driving circuit is formed must be limited. For example, in order to attain the image display apparatus having the definition of 200 pixels/inch with the pixels of the vertical color stripes, the interval of the signal lines is required to be 2.54 mm÷200÷3 (colors)≅42 μm. The circuit for driving one signal line must be disposed in this interval.

However, when the image display apparatus having the definition of 200 pixels/inch is tried to be constructed according to the conventional construction, the interval between the signal lines cannot be achieved as required because of the large number of the wiring lines.

That is, the prior image display apparatus is constructed in the following manner in order to transfer the 6-bit binary data to the DA converter. The data bus and the one latch are connected through the six lines, the one latch and the other latch are connected through the six lines, and the other latch and the DA converter are connected through the six lines. In addition, the image display apparatus uses two types of metals (namely, the gate metal used for the gate electrode of the thin film transistor (hereinafter, referred to as "TFT") and the wiring metal connected to the source and drain electrodes of the TFT. It should be generally avoided to use three or more types of metals because of increasing the number of the processing steps, and hence the cost. Therefore, the six wiring lines (longitudinal lines) for connecting the data bus and the DA converter between which the two latches are provided, and the group of the lateral gradation voltage lines arranged to intersect the longitudinal lines at the DA converter are formed as two separate wiring layers. As a result, the six longitudinal lines cannot be overlapped each other, so that they are obliged to be formed in parallel. Accordingly, when the space and the wiring line are selected to be 4 μm and 4 μm according to the layout rule, the six wiring lines need the total width of (4+4)×6 (lines)=48 pm, which thus exceeds the required line width of 42 pm.

Moreover, the number of the TFTs is greatly affected by the increase of the gradation number. When the bit number of data is k, the DA converter alone needs the arrangement of the TFTs, the number of which is $k \times 2^k$ (e.g., 384 when k is 6). In addition, in order to provide two k-bit latches, it is necessary to use the layout rule of 1 pm or below, which is actually impractical.

Also, the power consumption of the driving circuit incorporated in the image display apparatus is required to be as small as possible. That is, the power consumption of the image display apparatus greatly affects the operating time of the battery-powered product with this display apparatus used. The data bus consumes power as a part of the power consumption of the driving circuit. The data bus functions to transmit the input data from the outside to the latches. The data bus is one of the wiring lines having the fast data transmission rate and the large power consumption. The power consumption of this data bus is proportional to the wiring capacitance, the number of the data changes, and the square of the signal voltage. Therefore, the power consumption of the data bus can be effectively reduced by decreasing the wiring capacitance, the number of the data changes, and the signal voltage. The wiring intersection capacitance of the wiring capacitance of the data bus is the great part.

Here, it is assumed that "k" represents the number of the wiring lines of the data bus. (k−1) (five when six bits are used) intersections per signal line are necessary as the wiring intersections of the data buses in order for the data from the data bus to be taken out at the one latch as in the prior art. Regarding the number of the data changes (the number of times that data is changed from "0" to "1" or from "1" to "0"), when "k" is assumed to be the number of the wiring lines of the data bus, the average data changes per data is k/2 (3 when six bits are used), and the maximum number of the data changes is k (6 when six bits are used).

SUMMARY OF THE INVENTION

An object of the present invention is to provide an image display apparatus and a driving method thereof that can reduce the area of the non-display region relative to the display region for displaying the high-definition multi-tone image.

According to the present invention, in order to achieve the above object, there is provided an image display apparatus comprising:

image display means including a pixel in a region near an intersection at which each of signal lines and each of scanning lines are intersected each other, the signal lines and the scanning lines being arranged in a matrix shape, and the pixel being connected to the signal line and the scanning line via an switch element;

a group of gradation voltage lines applied analogue gradation voltages in accordance with display gradations;

decoder means for producing switch drive signals by which any one of the gradation voltage lines is selected in accordance with digital high-gradation image data;

trigger signal output means for sequentially producing trigger signals in accordance with the image data; and a plurality of switch means for selecting a specified gradation voltage line in response to the switch drive signals under condition in which the trigger signals are inputted, to supply a gradation voltage from the specified gradation voltage line to a specified signal line.

The following elements can be added when the above image display apparatus is constructed.

(1) The decoder means is divided into a plurality of decoders which are arranged to oppose each other.
(2) A plurality of switch drive lines for transmitting the switch drive signals are connected to the decoder means; a plurality of trigger lines for transmitting the trigger signals are connected to the trigger signal output means; and output lines for transmitting the specified gradation voltage to the specified signal line are connected to the plurality of switch means.
(3) The plurality of switch drive lines and the group of gradation voltage lines are arranged to intersect the plurality of trigger lines and the output lines.
(4) The group of gradation voltage lines are arranged in parallel along the plurality of switch drive lines.
(5) The switch drive lines is arranged in parallel with one gradation voltage line of the group of gradation voltage lines.
(6) Two switch drive lines of the switch drive lines are arranged in parallel on both sides of one gradation voltage line of the group of gradation voltage lines.
(7) The group of gradation voltage lines and the plurality of switch drive lines are formed as a same wiring layer.
(8) The plurality of trigger lines and the output lines are formed as a same wiring layer.
(9) Distribution means for distributing output voltages from the output lines to the plurality of signal lines is provided between the output lines and the plurality of signal lines.
(10) The group of gradation voltage lines and the plurality of switch drive lines are made of a wiring material of aluminum or copper.
(11) When n is a display gradation number, a wiring number of the group of gradation voltage lines is in a range from n to 2n.
(12) The image display means, the group of gradation voltage lines, the plurality of switch means and the trigger signal output means are formed on a same substrate.
(13) The decoder means is disposed on a surface of the substrate or on a periphery of the substrate.
(14) The image display means, the group of gradation voltage lines, the plurality of switch means, the decoder means and the trigger signal output means are formed on a same substrate.
(15) The trigger signal output means is formed using a shift register circuit.
(16) Each of the plurality of switch means includes: a first thin film transistor which becomes conductive by being inputted the trigger signal to transmit the switch drive signal; and a second thin film transistor which becomes conductive by the switch drive signal produced from the first thin film transistor to transmit a gradation voltage to the output line.
(17) Each of the plurality of switch means includes a condenser for holding the switch drive signal produced from the first thin film transistor.
(18) The condenser is an electrostatic capacity formed by overlapping any one gradation voltage line of the group of gradation voltage lines and an electrode formed in a wiring layer different from the group of gradation voltage lines.
(19) Each of the plurality of switch means includes memory means for storing the switch drive signal produced from the first thin film transistor as at least one-bit information.
(20) The plurality of switch means are disposed in regions near intersections at which the switch drive lines and the trigger lines are intersected each other, respectively.
(21) The first thin film transistor and the second thin film transistor are formed using n-channel thin film transistors when the gradation voltage on the gradation voltage line is relatively smaller than a signal voltage on the switch drive line, and are formed using p-channel thin film transistors when the gradation voltage on the gradation voltage line is relatively higher than the signal voltage on the switch drive line.
(22) Each of the plurality of switch means includes voltage level conversion means for amplifying the switch drive signal.
(23) Wiring lines for supplying a particular voltage and a common signal to the voltage level conversion means are arranged in parallel in the group of gradation voltage lines.
(24) It further includes voltage generation means for applying different voltages to the group of gradation voltage lines.
(25) The voltage generation means includes a plurality of ladder resistors connected in series with a voltage source.
(26) The voltage generation means is formed on a same substrate as the image display means, the group of gradation voltage lines, the plurality of switch means and the trigger signal output means.
(27) Each of the pixel includes a liquid crystal interposed between a pair of substrates including a transparent insulating substrate; and a light transmission factor of the liquid crystal is changed in accordance with a voltage fed from the switch element connected to the pixel.
(28) Each of the pixels includes a light emitting film formed on an insulating substrate; and a light emission intensity of the light emitting film is changed in accordance with a voltage from the switch element connected to the pixel.
(29) It further includes scanning means for sequentially supplying scanning pulses to the plurality of scanning lines.
(30) When the image display apparatus is driven, a drive frequency at which the switch drive signals are supplied from the decoder means to the plurality of switch drive lines is set to twice or more as high as a drive frequency at which the trigger signals are supplied from the trigger signal output means.
(31) The number of simultaneous data switching for a gradation data inputted to the decoder means is two or less; and the decoder means sequentially produces switch drive signals for selecting one single switch drive line in accordance with the gradation data.

According to the above means, the decode means is constructed to have the digital/analogue conversion function for converting the gradation data to the analogue signal, and the function for selecting the signal line. A specified gradation voltage line is selected in accordance with the switch drive signal from the decoder means and the trigger signal from the trigger signal output means. The gradation voltage on the selected gradation voltage line is supplied to a specified signal line. Therefore, the area occupied by the signal line drive circuits provided in the non-display region can be reduced to be smaller than the display region in which the high-definition multi-tone images are displayed.

In addition, since the decoder means is used to select one single gradation voltage line, the number of the switch drive lines on which data is changed is maximum "2", so that the number of times that data is changed is reduced. Thereby, even if the capacitance between the wiring lines is charged or discharged each time data is changed, the power consumption can be lowered by the reduction of the number of times that data is changed.

Moreover, when the multi-tone images are displayed, the intersection wiring lines (i.e., the intersection wiring line capacitance) can be reduced, so that the power consumption on the switch drive lines for transmitting the fast signals can be reduced.

BRIEF DESCRIPTION OF THE DRAWINGS

FIG. 6 is a diagram for explaining the logic of the decoder shown in FIG. 5;

FIG. 16 is a diagram for explaining the logic of the decoder when an image display apparatus according to the present invention is constructed as a liquid crystal display apparatus;

FIG. 19 is a diagram for explaining the logic of the decoder when an image display apparatus according to the present the invention is constructed as a liquid crystal display apparatus;

DETAILED DESCRIPTION OF THE EMBODIMENTS

Figure 1:
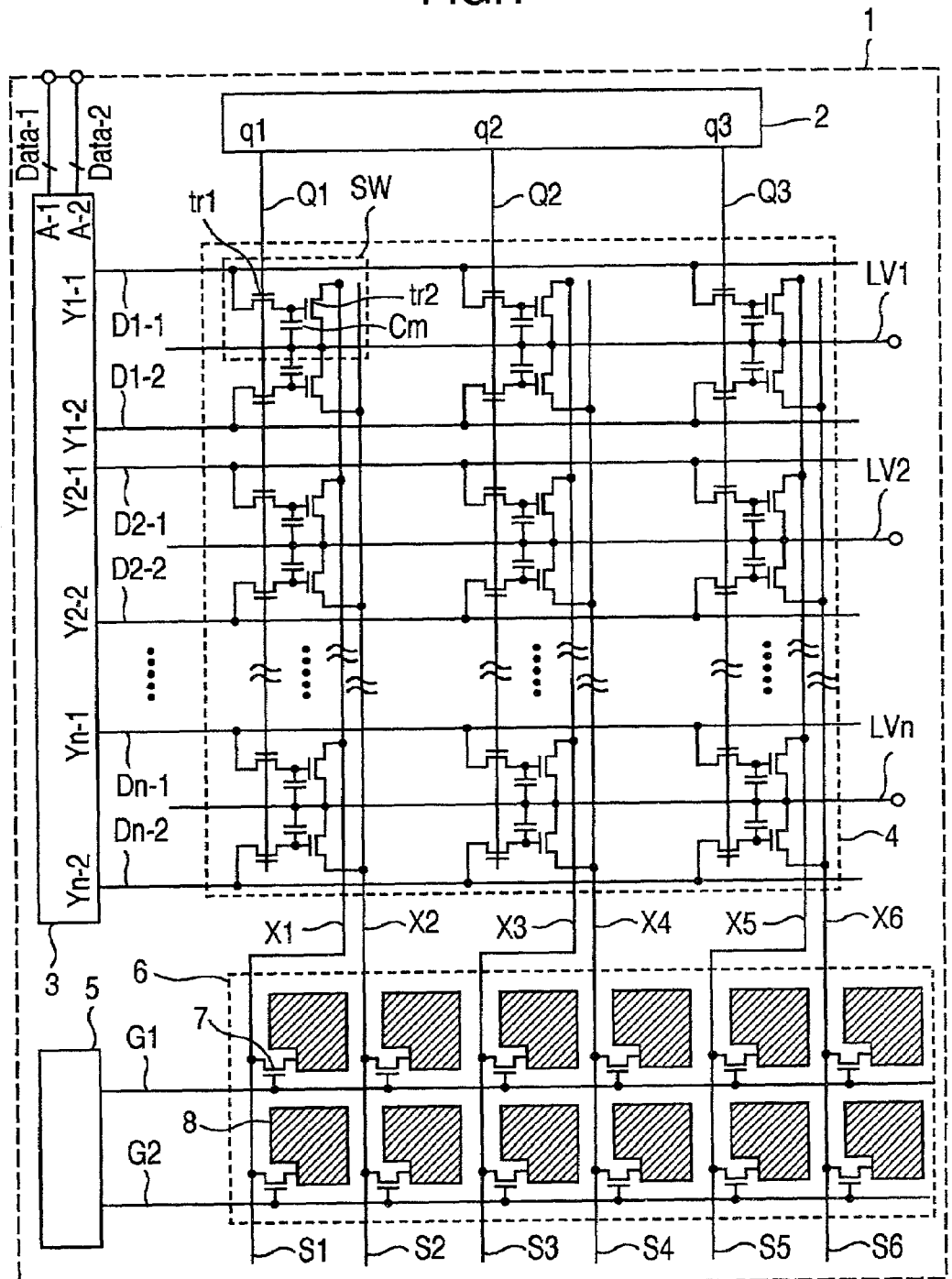
FIG. 1 is a diagram showing the construction of a main part of an image display apparatus according to an embodiment of the present invention.

One embodiment of the present invention will be described with reference to drawings. FIG. 1 is a diagram showing the construction of the main part of an image display apparatus according to one embodiment of the present invention. Referring to FIG. 1, on an insulating substrate 1, there are formed a shift register 2, a decoder 3, a DA converter 4, a scanning circuit 5 and a display region 6. This display region 6 is formed as a region for displaying the high-definition multi-tone image. A plurality of signal lines S1–S6 and a plurality of scanning lines G1 and G2 are disposed in the display region 6 in a matrix shape. Pixel TFTs 7 functioning as switch elements, and pixels 8 are formed in the respective regions near the intersections of the signal lines and the scanning lines. The gate electrodes of the pixel TFTs 7 are connected to the scanning lines G1 and G2, their source electrodes are connected to the signal lines S1–S6, and their drain electrodes are connected to the pixels 8 as illustrated.

In this embodiment, six signal lines, two scanning lines, 6×2 pixel TFTs 7 and 6×2 pixels 8 are shown for the sake of simple explanation. However, these numbers are actually dependent on the number of the pixels 8. For example, when the display amount information of the image display apparatus corresponds to the color VGA, each of the numbers of the pixels 8 and the pixel TFTs 7 are 640×480×3 (red, green and blue). Thus, the numbers of the signal lines and the scanning lines are 640×3 (red, green and blue) and 480, respectively.

In the non-display region other than the display region 6, there are formed the scanning circuit for sequentially supplying the scanning pulses to the scanning lines G1 and G2, and the shift register 2, the decoder 3 and the DA converter 4 as the driving circuits for driving the signal lines S1–S6.

The DA converter 4 has n gradation voltage lines LV1–LVn as a group of gradation voltage lines, 2×n switch drive lines D1-1 to Dn-1 and D1-2 to Dn-2, trigger lines Q1–Q3, and output lines X1–X6 formed in order to convert the multi-tone gradation data to the analogue gradation voltages. The switch drive lines D1-1 to Dn-1 and D1-2 to Dn-2 are connected to the output ends of the decoder 3, the trigger lines Q1–Q3 are connected to the output ends of the register 2, and the output lines X1–X6 are connected to the signal lines S1–S6.

The positional relation between the switch drive lines and the gradation voltage lines is such that when an arbitrary natural number i satisfies the condition of i≦n, switch drive lines Di-1 and Di-2 are disposed on both sides of the i-th gradation voltage line LVi to run in parallel with the voltage line. In other words, two switch drive lines are provided on both sides of each gradation voltage line in order that the region between the switch drive lines can be effectively used.

In addition, the trigger lines Q1–Qn are disposed to intersect the switch drive lines, and two output lines are provided in parallel with each trigger line. Switch circuits SW are provided near the intersections of the switch drive lines or the gradation voltage lines to the trigger lines Q1–Q3 or the output lines X1–X6 as illustrated.

Different voltages V1–Vn as the gradation voltages corresponding to the display gradations are applied on the gradation voltage lines LV1–LVn, respectively. Each of the gradation voltage lines is made of a low-resistivity wiring material such as aluminum or copper, and one end of each of the gradation voltage lines is connected to voltage generation means.

Figure 2:
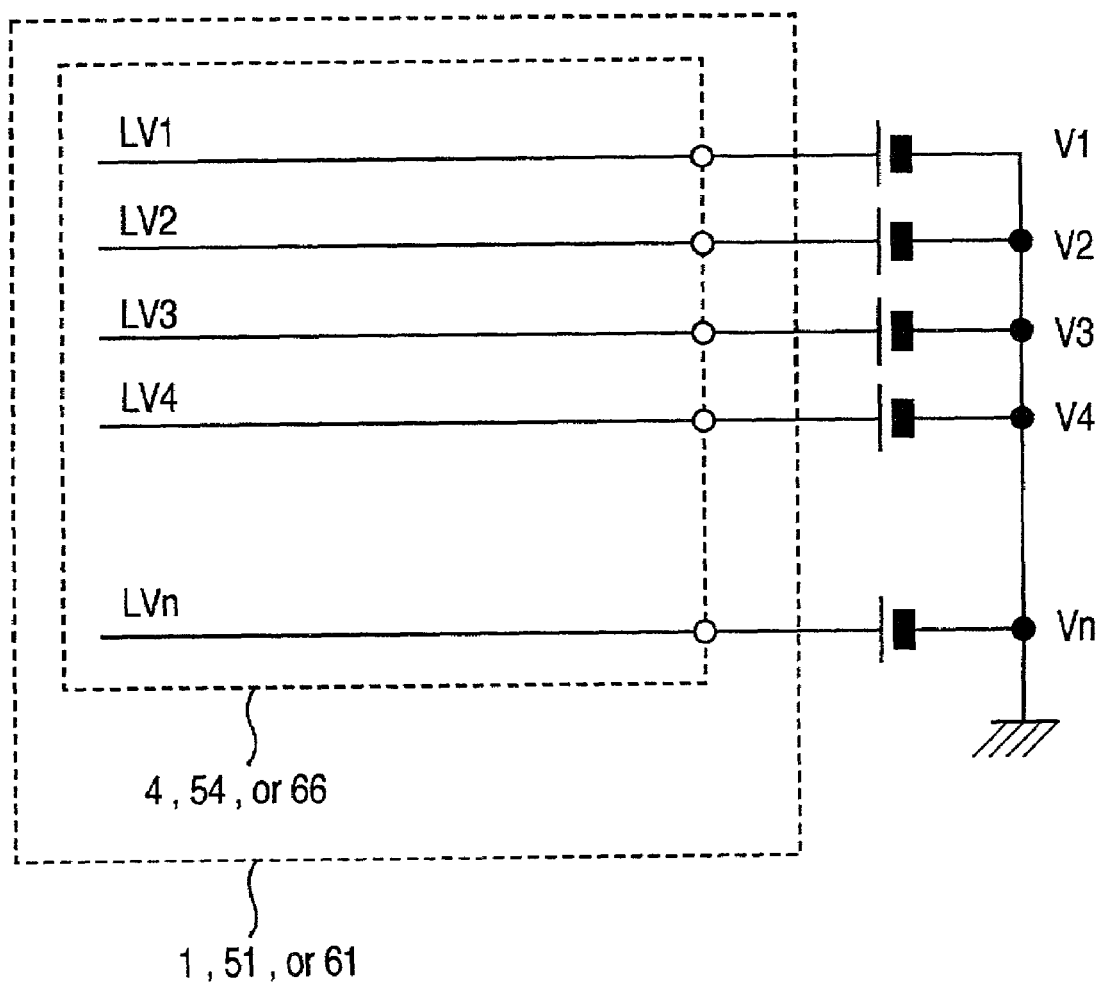
FIG. 2 is a diagram for explaining a method of generating gradation voltages from a plurality of voltage sources.
Figure 3:
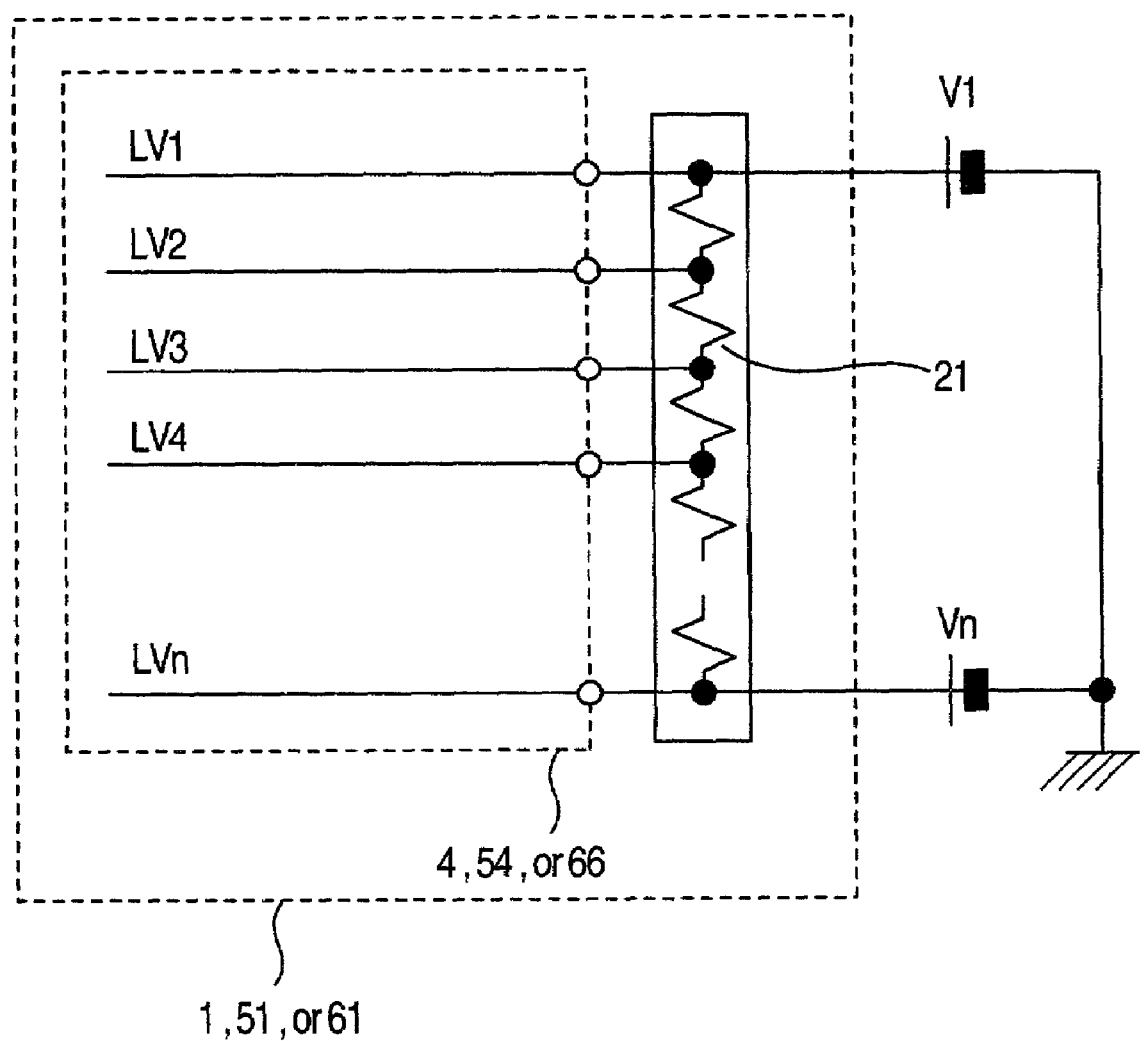
FIG. 3 is a diagram for explaining a method of generating the gradation voltages using a ladder resistor.

This voltage generation means may be n voltage sources the number of which is equal to the gradation number, as shown in FIG. 2, for example. Alternatively, it may be the following voltage sources as shown in FIG. 3. A plurality of ladder resistors 21 are connected in series between the voltage sources which generate the voltages V1 and Vn, so that the difference voltage between the voltages V1 and Vn are divided. The voltages V1 and Vn and the divided voltages are applied to the gradation voltage lines LV1–LVn as the gradation voltages V1–Vn, respectively. The order in which the gradation voltage lines LV1–LVn are arranged and the order in which the voltages V1–Vn are applied are particularly not limited.

The switch circuit SW includes an n-channel TFT tr1, an n-channel TFT tr2 and a condenser (electrostatic capacity) Cm. The TFT tr1 functioning as the first thin film transistor has the gate electrode connected to the trigger line Q1, the source electrode connected to the gradation voltage line D1-1, and the drain electrode connected to one end of the condenser Cm. Thereby, the TFT tr1 becomes conductive in synchronism with the trigger signal transmitted on the trigger line Q1, and allows the data on the switch drive line D1-1 (switch drive signal) to be sampled by the condenser Cm. The condenser Cm is used as storage means for storing one-bit data, and has the other end connected to the gradation voltage line LV1, or substantially grounded on an AC basis.

Figure 4:
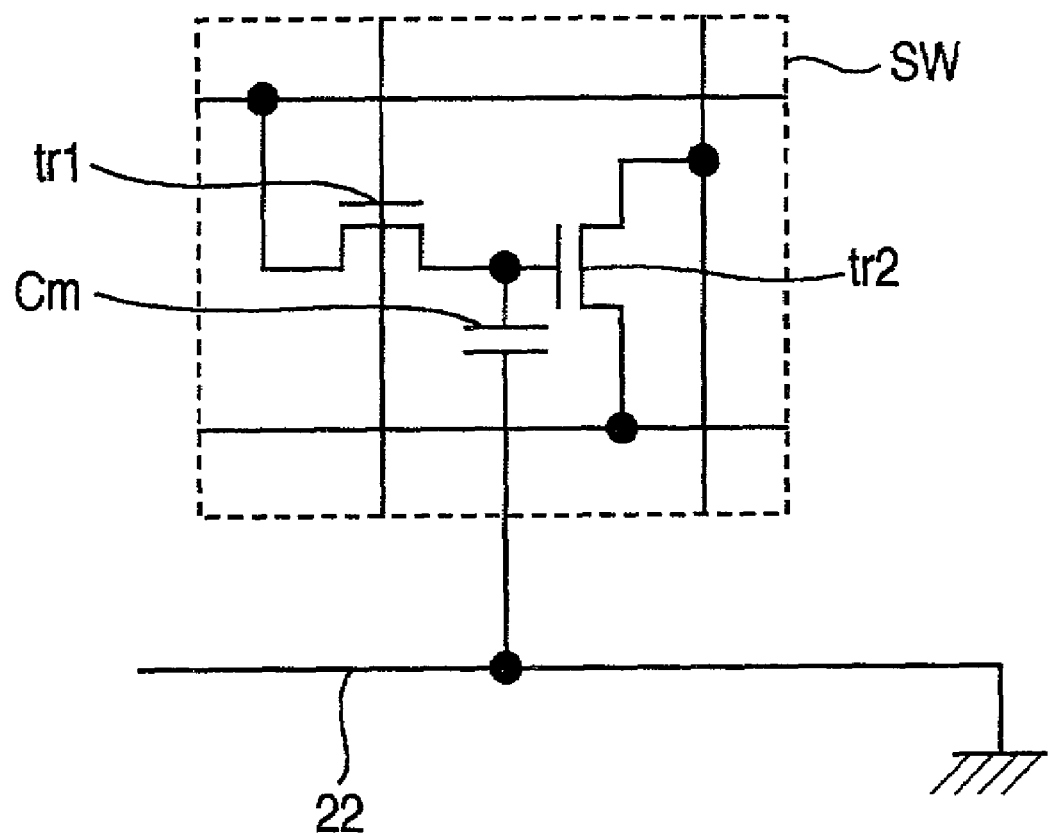
FIG. 4 is a circuit diagram showing another example of a switch circuit used in an image display apparatus according to the present invention.

When the condition of substantially AC grounding cannot be obtained, the other end of the condenser Cm can be connected to a ground line 22 instead of the gradation voltage line LV1, as shown in FIG. 4.

The drain electrode of the TFT tr1 is also connected to the gate electrode of the TFT tr2 functioning as the second thin film transistor. The source and drain electrodes of the TFT tr2 are connected to the gradation voltage line LV1 and the output line X1, respectively. Thereby, the TFT tr2 functions as the switch controlled on/off according to the data sampled in the condenser Cm. In other words, the TFT tr2 is turned ON (conductive) when the high voltage is applied to the condenser Cm, and turned OFF (nonconductive) when the low voltage is applied to the condenser Cm.

The switch circuit SW functions as the following switch means. When the trigger signal is applied, the switch means selects the specified gradation voltage line LV1 in response to the data (switch drive signal) from the switch drive line. Then, the switch means supplies the gradation voltage V1 from the specified gradation voltage line LV1 to the signal line S1 via the output line X1. The switch circuits arranged in a matrix shape at all the intersections of the output lines X1–X6 and the switch drive lines D1-1 to Dn-1 and D1-2 to Dn-2 are similarly constructed as mentioned above.

The decoder 3 is constructed as the decoder means which produces the switch drive signal for selecting any gradation voltage line according to the digital multi-tone image data (n-bit image data, for example, image data of six-bit 64 gradations). The decoder 3 in this embodiment has two separate data lines Data-1 and Data-2 from which the image data is supplied so that data of "1" (switch drive signal) can be fed to two switch drive lines according to the multi-tone image data.

Figure 5:
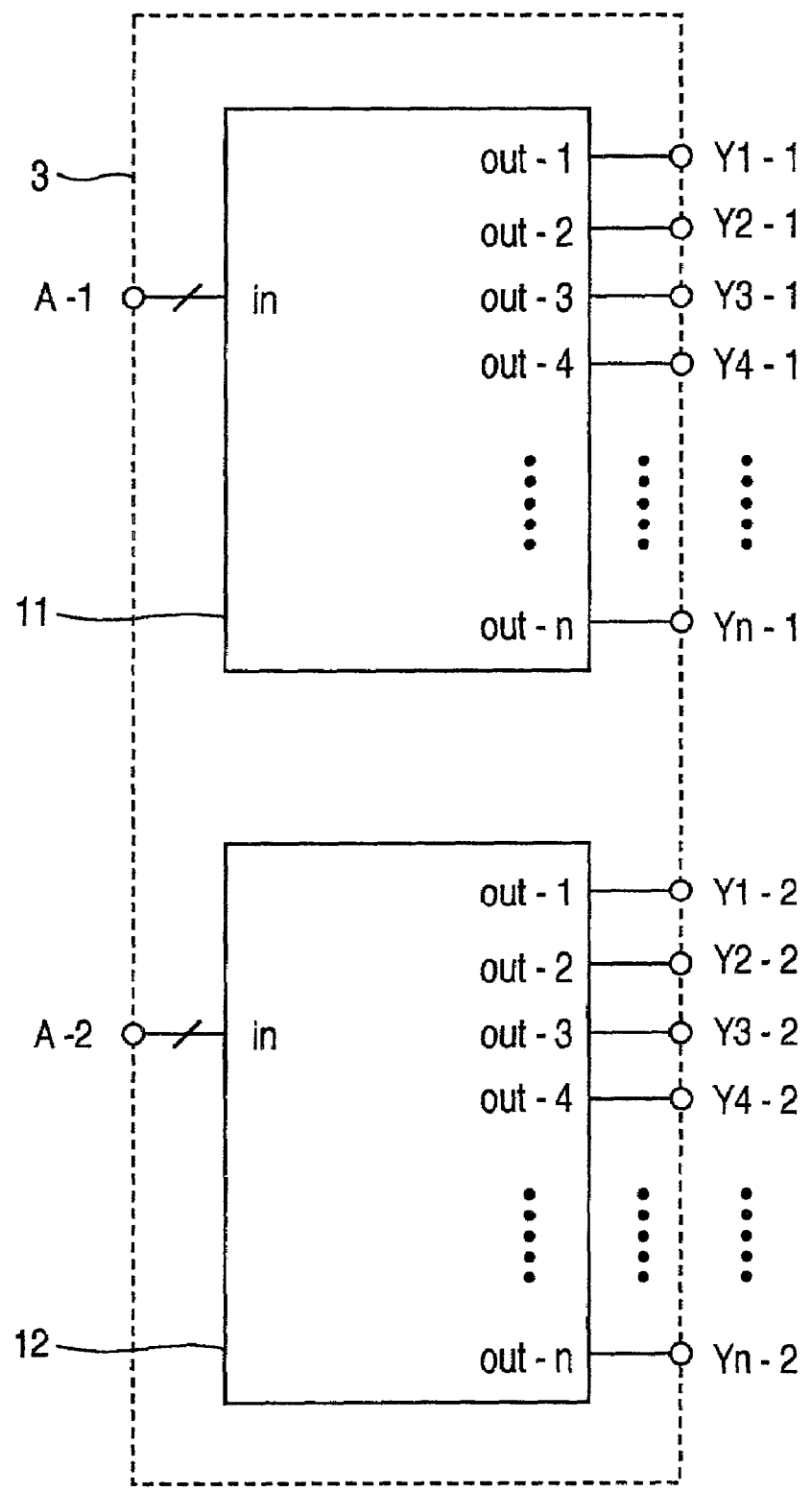
FIG. 5 is a block diagram of a decoder used in an image display apparatus according to the present invention.

In other words, the decoder 3 has two decoders 11 and 12 as shown in FIG. 5. When the high-gradation image data are supplied from the data lines Data-1 and Data-2 to the input terminals A-1 and A-2, the decoders 11 and 12 produce "1" signal (switch drive signal) at only a single output terminal of each of two separate output terminals Y1-1 to Yn-1 and Y1-2 to Yn-2, and "0" signal at the other output terminals according to the logic shown in FIG. 6.

Here, "1" means the high voltage, and "0" means the low voltage. The input in is binary data. Although the data inputting to the input in is expressed by 1 through n for the sake of better understanding, it may be any n different values such as figures of 0 through (n−1). In addition, although two separate input terminals A-1 and A-2 are provided as the input terminals of the decoder 3, a separator may be provided before the input terminals of the decoders 11 and 12 so that a single input terminal can be effective.

Figure 7:
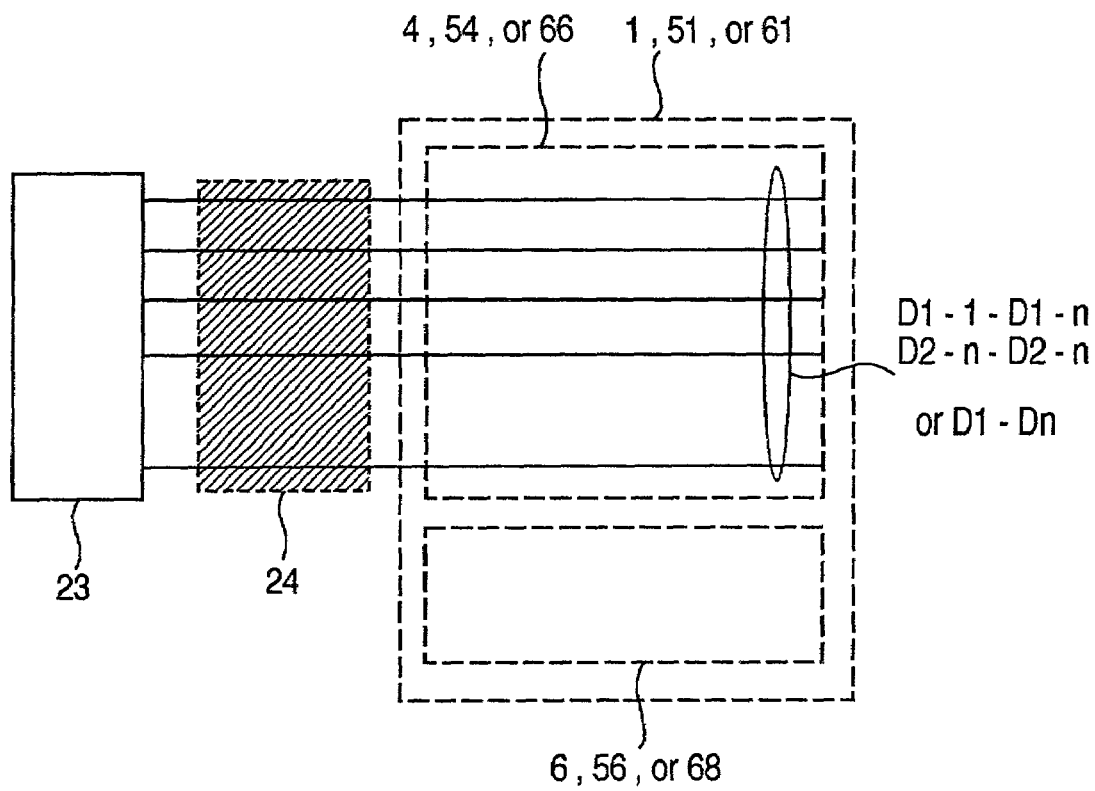
FIG. 7 is a block diagram of an arrangement where the decoder shown in FIG. 1 is used as an external IC.

Although the decoder 3 is provided on one side, the decoders 11 and 12 may be provided on both sides of the DA converter 4, respectively. In addition, the decoder 3 may be provided as an external IC 23 on the outside of the insulating substrate 1 so that the external IC 23 can be connected via a flexible cable (FPC) 24 to the insulating substrate 1 as shown in FIG. 7. Also, the external IC 23 may be mounted directly on the surface of the insulating substrate 1.

Figure 8:
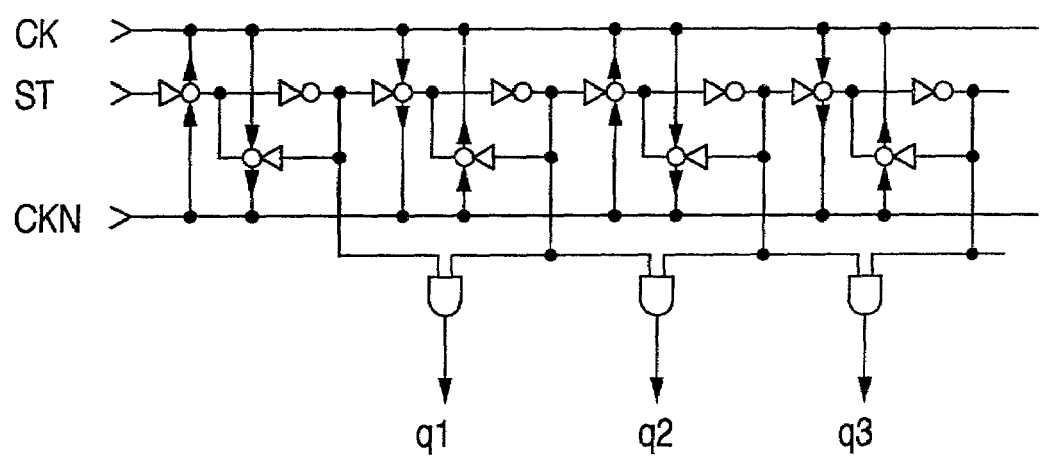
FIG. 8 is a circuit diagram of a shift register in an image display apparatus according to the present invention.
Figure 9A:
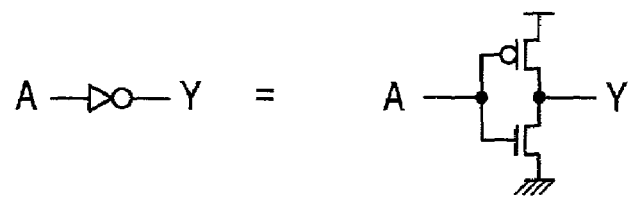
FIGS. 9A–9C are diagrams for explaining constitution components of the shift register shown in FIG. 8.
Figure 9B:
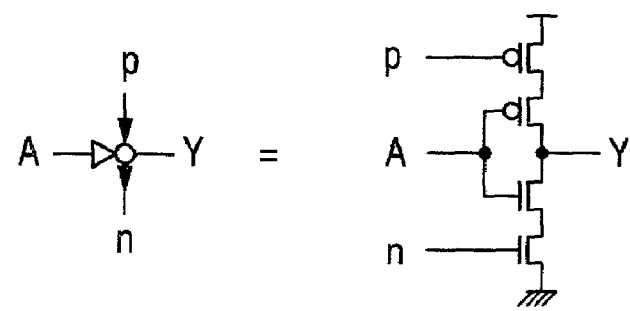
Figure 9C:
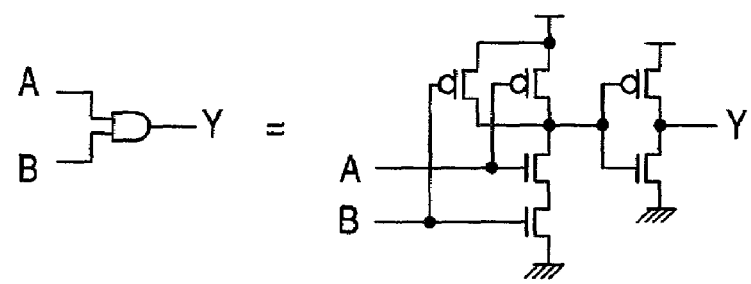
Figure 10:
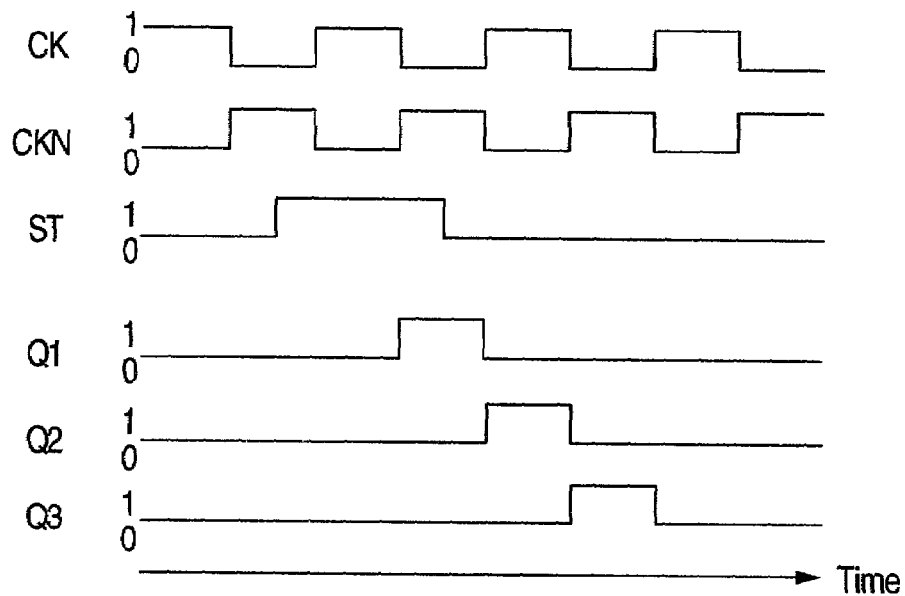
FIG. 10 is a time chart for explaining the operation of the shift register shown in FIG. 8.

The shift register 2 as trigger signal output means for sequentially producing the trigger signals in synchronism with the image data is constructed using inverters, clocked inverters and AND gates, as shown in FIG. 8, for example. The inverters, the clocked inverters and the AND gates can be constructed by circuits using TFTs, as shown in FIGS. 9A–9C, respectively. The shift register 2 responds to a clock CK, a reverse-phase clock CKN and a start pulse ST to sequentially generate the trigger signals (trigger pulses) q1, q2 and q3 from the AND gates. Although the trigger pulses q1–q3 are produced in turn from the shift register 2, the order in which the trigger pulses are generated depends on the relation between the input data and the signal lines, and it is thus particularly not limited.

The scanning circuit 5 is constructed using the similar circuits as is the shift register 2, for example, and is constructed as scanning means for sequentially producing the scanning pulse signals on the scanning lines G1 and G2.

Figure 11:
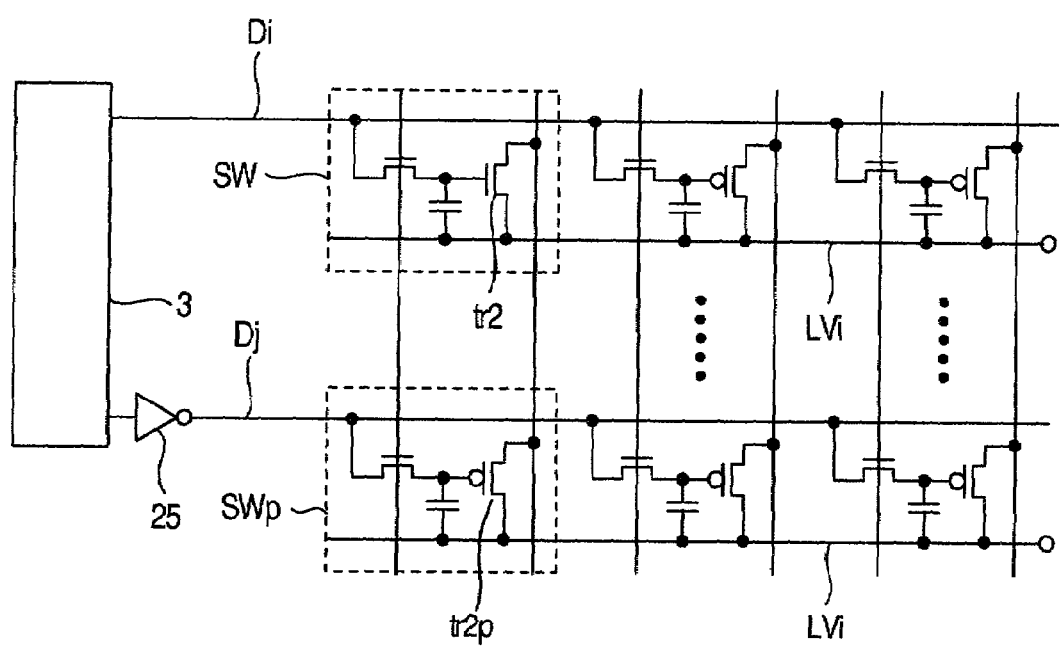
FIG. 11 is a circuit diagram of another example of the switch circuit used in the image display apparatus according to the present invention.

The n-channel TFTs are used for the switch circuits SW of the DA converter 4 as described above. However, the mixture of the switch circuits SW using the n-channel TFTs, and the switch circuits SWp using the p-channel TFTs can be used to construct the DA converter 4, as shown in FIG. 11. In other words, when the gradation voltage of the gradation voltage line LVi is relatively lower than the signal voltage of the switch drive line Di, the signal source voltage to the switch drive lines can be reduced by using the n-channel TFT tr2. On the other hand, when the gradation voltage of the gradation voltage LVj is relatively higher than the signal voltage of the switch drive line Dj, the signal source voltage to the switch drive lines can be reduced by using the p-channel TFTs tr2p. In this case, when the switch circuits SWp using the p-channel TFTs are connected to the decoder 3, an inverter 25 can be provided between the decoder 3 and the switch circuit SWp in order to invert the output logic of the decoder 3, or the structure for inverting the logic can be employed within the decoder 3.

Figure 12:
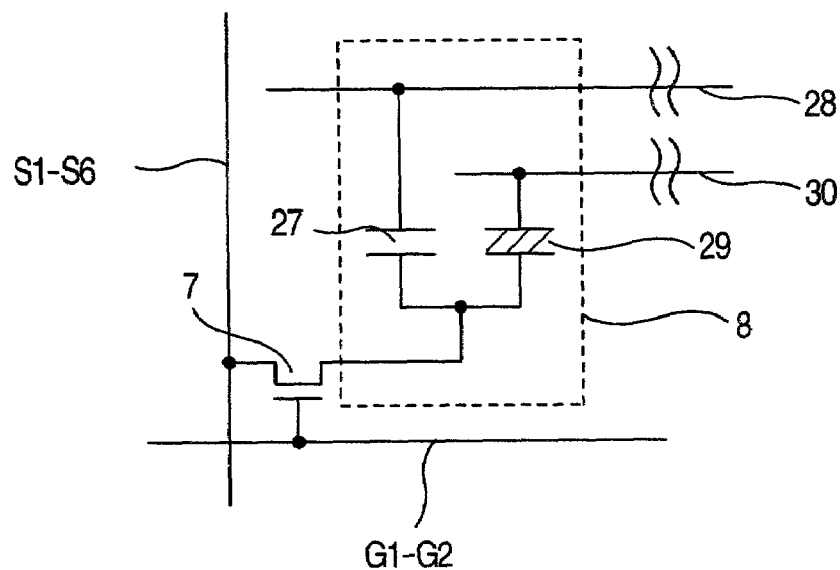
FIG. 12 is a diagram showing the structure of an pixels when an image display apparatus according to the present invention is constructed as a liquid crystal display apparatus.

When the image display apparatus is used as a liquid crystal display apparatus, the pixels 8 provided in the display region 6 can be each constructed by a condenser 27 that holds the voltage sampled by the pixel TFT 7, and a liquid crystal layer 29 interposed between the insulating substrate 1 and the opposed substrate (transparent substrate), as shown in FIG. 12. The condenser 27 has its one end connected to a ground line 28 so that the voltage sampled by the pixel TFT 7 can be stably held for one-frame period. The liquid crystal layer 29 has its one end connected to a common electrode 30 so that the difference voltage between the voltage held on the condenser 27 and a voltage Vc applied on the common electrode 30 can be applied across the liquid crystal layer 29. Thereby, it is possible to change the light transmission factor of the liquid crystal layer (liquid crystal) 29 to display the image.

Figure 13:
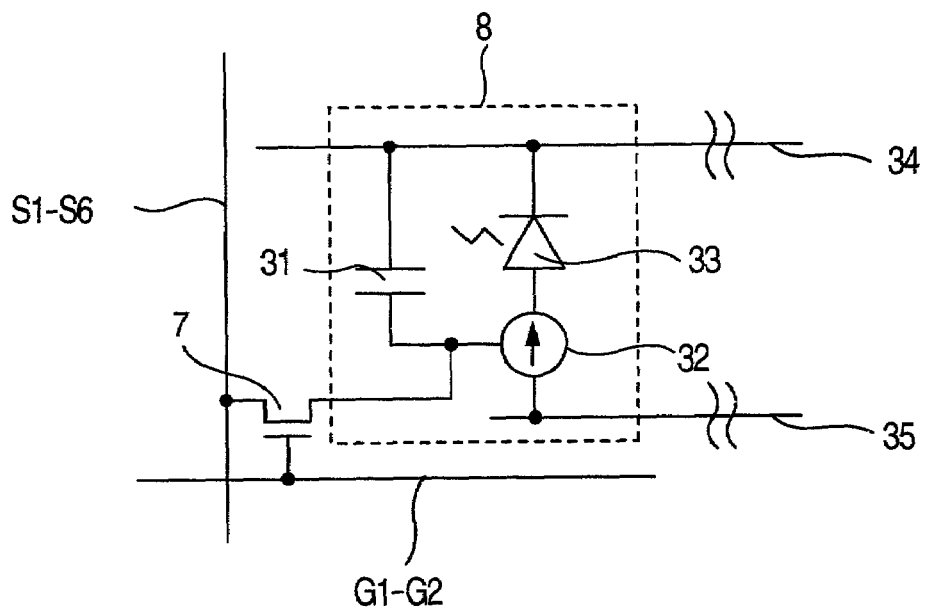
FIG. 13 is a diagram showing the structure of an pixel when an image display apparatus according to the present invention is constructed as a self-emitting type display apparatus.

When the image display apparatus is used as a self-emitting type display apparatus, the pixels 8 can be each constructed by a condenser 31 for holding the voltage sampled by the pixel TFT 7, a voltage/current conversion circuit 32 for converting the voltage sampled by the pixel TFT 7 into the current, and a light-emitting layer 33, as shown in FIG. 13. The one ends of the condenser 31 and the light-emitting layer 33 are connected to a ground line 34, and the voltage from a power source line 35 is applied to the voltage/current conversion circuit 32. When the external voltage is applied between the power source line 35 and the ground line 34, and the sampled voltage is held on the condenser 31, the light emission intensity of the light emitting layer 33 can be changed in accordance with the held voltage, thus displaying the image.

Figure 14:
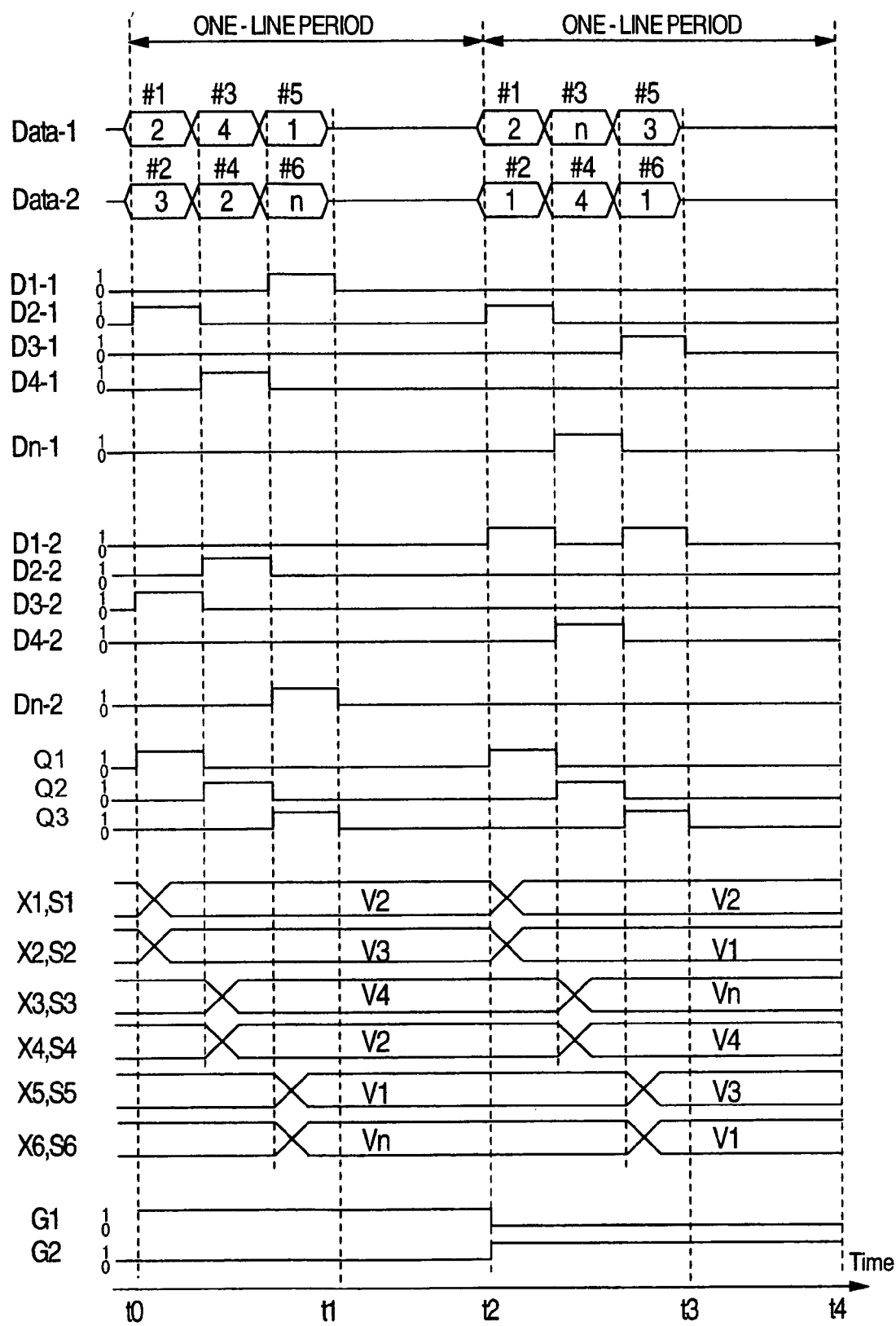
FIG. 14 is a time chart for explaining the operation of an image display apparatus according to the present invention.

When the image is displayed on the display region 6, the circuits of the image display apparatus operate as shown in FIG. 14. First, as the multi-tone image data, the odd-numbered image data is applied to the data line Data-1 of the decoder 3, and the even-numbered image data is applied to the data line Data-2 of the decoder 3. For example, when a row of image data #1–#6, which are displayed on the display region 6, are [2, 3, 4, 2, 1, n] from left to right in turn, the image data [2, 4, 1] is fed to the data line Data-1, and the image data [3, 2, n] is fed to the data line Data-2. When the image data is decoded by the decoder 3, one of the switch drive lines D1-1 to Dn-1 is turned "1", and one of the switch drive lines D1-2 to Dn-2 turned "1", as the switch drive lines selected by the image data. The shift register 2, in synchronism with the input of this image data, outputs the trigger pulses on the trigger lines Q1–Q3 in turn. When the trigger pulses are sequentially output, the n-channel TFTs tr1 connected to the trigger lines Q1–Q3 are turned ON, thus sequentially sampling the data on the switch drive lines. Of the switch circuits SW connected to the trigger lines Q1–Q3, the switch circuits SW with data of "1" produced on the switch drive lines stores the data of "1" corresponding to the image data. Further, the switch circuits SW with data of "1" produced on the switch drive lines stores data of "0". These stored data are held until these data are sampled again. During this interval, the TFTs tr2 of the switch circuits SW that have stored data of "1" are turned ON. Thereby, the gradation voltages on the gradation voltage lines, which are connected to the switch circuits SW with data of "1" stored, of the gradation voltage lines LV1–LVn are applied to the output lines.

In other words, according to the trigger pulses that start to be fed from time t0, the gradation voltages are sequentially fed to the output lines X1–X6, and then fed to the signal lines S1–S6. At time t1 when the first trigger pulse is generated from the trigger line Q3, the gradation voltages [V2, V3, V4, V2, V1, Vn] corresponding to the image data [2, 3, 4, 2, 1, n] are applied to all the signal lines S1–S6.

During the process in which the gradation voltages are applied to the signal lines S1–S6, the scanning circuit 5 sequentially produces the scanning pulses on the scanning lines G1 and G2 at intervals of one-line period. The one-line period is each of the time interval t0–t2 and the time interval t2–t4. The scanning line G1 is turned "1" during the one-line period t0–t2, and the scanning line G2 turned "1" during the next one-line period t2–t4.

When the scanning line G1 is "1", the path between the source electrode and the drain electrode in each of the first row pixel TFTs 7 which are connected to the scanning line G1 becomes conductive. Thereby, the gradation voltages from the signal lines S1–S6 are written in the first row pixels 8 during the time interval t1–t2 at the latest.

Similarly, during the time interval t2–t4, the gradation voltages [V2, V1, Vn, V4, V3, V1] corresponding to the image data [2, 1, n, 4, 3, 1] are applied to all the signal lines S1–S6 by time t3. The gradation voltages from the signal lines S1–S6 are written in the second row pixels 8 during the time interval t3–t4 at the latest. By the repetition of the above operations, it is possible to apply the aimed voltages to the pixels 8 in the whole display region 6, so that it is possible to display the image in the whole display region 6.

When the image display apparatus is driven, the drive frequency of the decoder 3 is the same as the frequency of the image data fed via the data lines Data-1 and Data-2. The switch circuits SW are respectively driven once during one-line period by the trigger pulses on the trigger lines. In this case, since at least two data are inputted during one-line period, the drive frequency of the decoder 3 is twice the drive frequency of the switch circuits SW, or more.

Here, when the image display apparatus is used as the liquid crystal display apparatus, the voltages to be applied to the pixels 8 are necessary to be the AC voltages with the polarities inverted every field. It is necessary to apply the AC voltages to the liquid crystal so that the light transmission factor can be changed by the root mean square values of the AC voltage. When the AC voltages with the polarities inverted every field are applied to the pixels, one of the following two methods can be employed.

Figure 15:
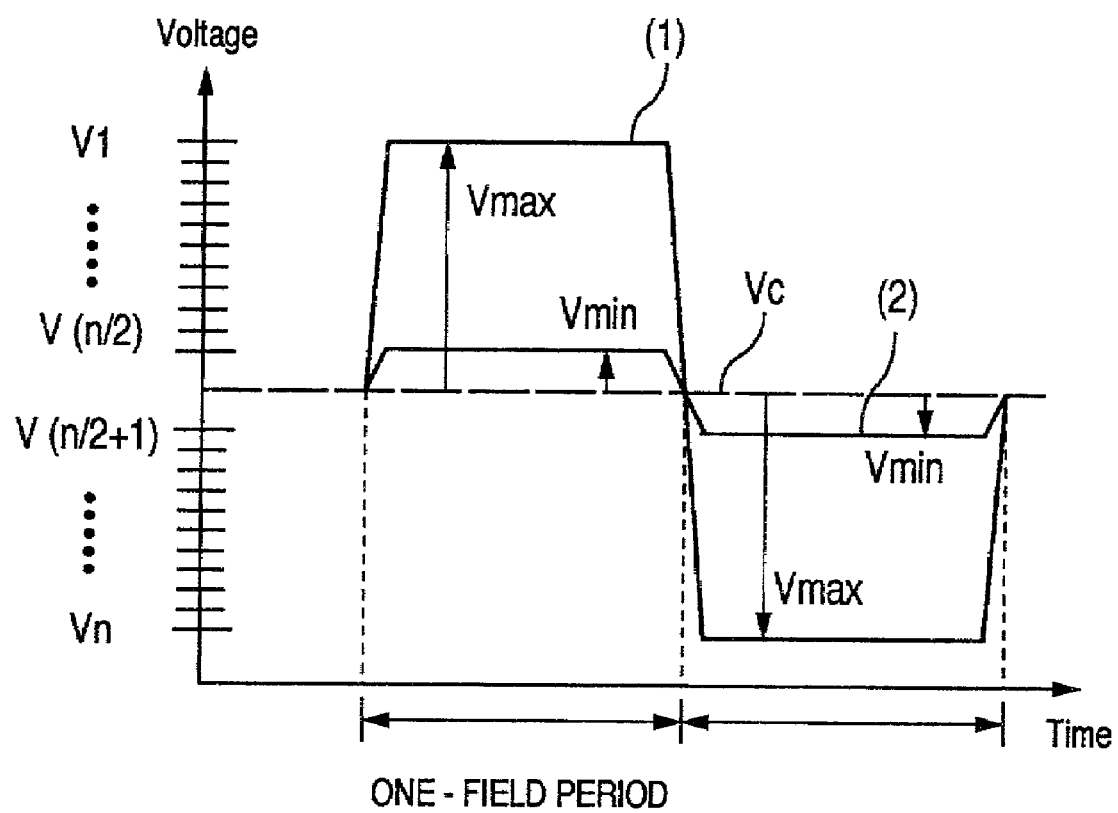
FIG. 15 is a diagram for explaining a alternation method when an image display apparatus according to the present invention is constructed as a liquid crystal display apparatus.

In the first method for the application of AC voltages, as shown in FIG. 15, the voltages to the pixels 8 are inverted every field by fixing the fixed voltage Vc applied to the common electrode 30 (the common electrode 30 shown in FIG. 12). The voltage V1 is the maximum voltage, and Vn is the minimum voltage. When the high AC voltage value Vmax is applied to the pixels 8, the voltages V1 and Vn are alternately produced every field as indicated by the line (1). When the low AC voltage value Vmin is applied to the pixels 8, the voltages V(n/2) and V[(n/2)+1] are alternately produced every field as indicated by the line (2).

In this case, the decoders 11 and 12 operate according to the logic shown in FIG. 16. In other words, the outputs out-1 to out-(n/2) and the outputs out-((n/2)+1) to out-n are switched at the odd-numbered field period and the even-numbered field period. Also, in this case, n is twice the gradation number that the image display apparatus can display. If the gradation bit number is 6 bits, the gradation number is 64. Thus, n=128. There is also a method for the AC voltage application in which two voltage values are alternately applied every field to the gradation voltage lines. In this case, n is the same as the gradation number that the image display apparatus can display. For example, if the gradation bit number is 6 bits, the gradation number is 64. Thus, n=64.

Figure 17:
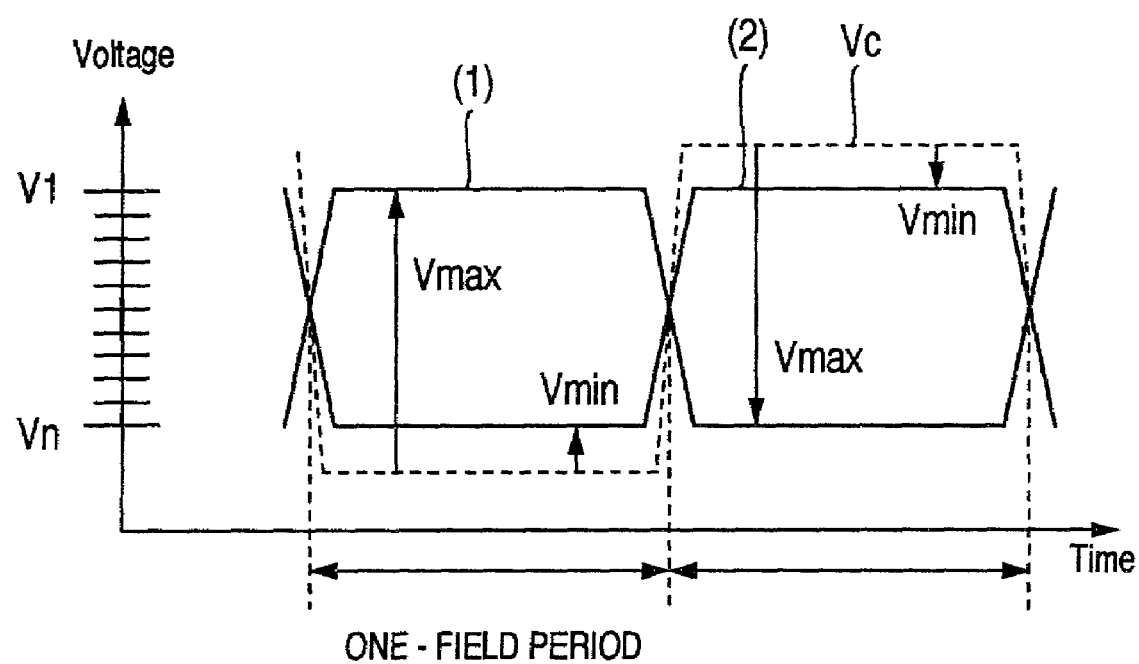
FIG. 17 is a diagram for explaining another alternation method of when an image display apparatus according to the present invention is constructed as a liquid crystal display apparatus.

In the second method for the AC voltage application, the common voltage Vc (the voltage applied to the common electrode 30 shown in FIG. 12) is changed to the AC voltage as shown in FIG. 17. In this case, the voltage range on the gradation voltage line becomes narrow enough to reduce the voltages to the circuits and the power consumption thereon. Here, V1 is the maximum voltage, and the Vn is the minimum voltage. When the high AC voltage value Vmax is applied to the pixels, the voltage V1 is produced every field period during which the common voltage Vc is the low voltage, and the voltage Vn is produced every field period during which the common voltage Vc is the high voltage, as shown by the line (1). When the AC voltage value Vmax is applied to the pixels 8, the voltages are applied with the combination opposite to that in the line (1), as shown by the line (2).

Figure 18:
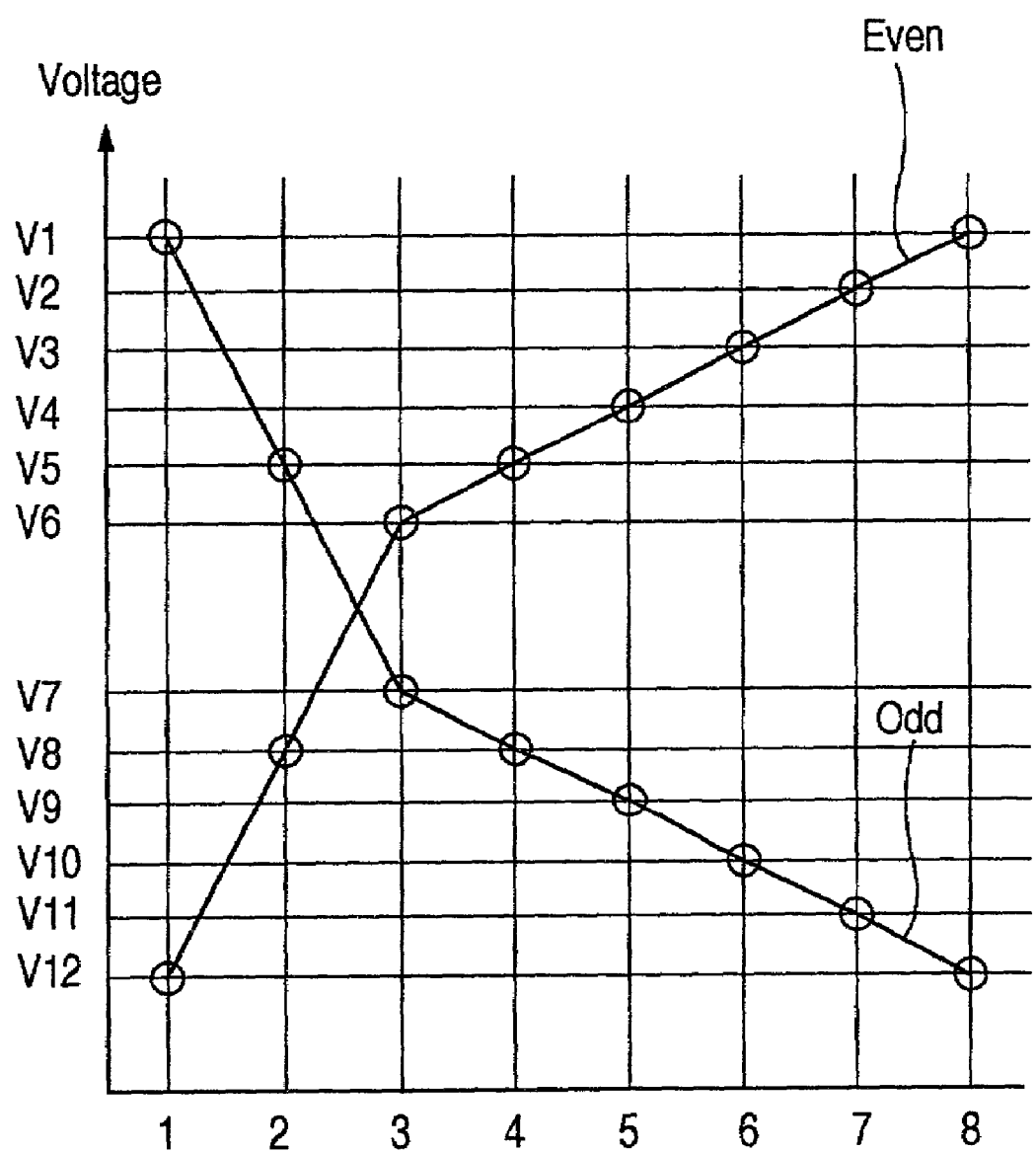
FIG. 18 is a graph for explaining the relation between the gradation and the voltage when an image display apparatus according to the present the invention is constructed as a liquid crystal display apparatus.

When the gradation number is "8" and the gradation voltages are asymmetrical with respect to the input data, the gradation voltages having the characteristics shown in FIG. 18 are selected. In FIG. 18, there are eight different output voltages in each of the odd-numbered fields, and there are eight different output voltages in each of the even-numbered fields. Further, four ones of the output voltages in the odd-numbered fields take the same values as those in the even-numbered fields, so that the four voltages can be used common to the odd-numbered and the even-numbered fields. In other words, when the voltages common to the odd-numbered and even-numbered fields are not used, eighteen different voltages are necessary. On the other hand, when the voltages V1, V5, V8 and V12 are used common to the odd-numbered and the even-numbered fields, only twelve different voltages are enough for the gradation voltages. Thus, the number of the necessary gradation voltage lines is n=12. In this case, the decoders 11 and 12 operate according to the logic shown in FIG. 19. For example, in each of the odd-numbered fields, the signal for selecting the voltage V1 is generated for the gradation "1", and the signal for selecting the voltage V5 is generated for the gradation "2". Similarly, the signals for sequentially selecting the voltages V7, V8, V9, V10, V11 and V12 are generated for the gradations "3", "4", "5", "6", "7" and "8".

The gradation number may be arbitrary, and the necessary number of the different voltages (namely, the number n of the gradation voltage lines) depends on the number of the voltages that can be used common to the odd-numbered and the even-numbered fields. The maximum number is twice the gradation number, and the minimum number is equal to the gradation number.

Figure 20:
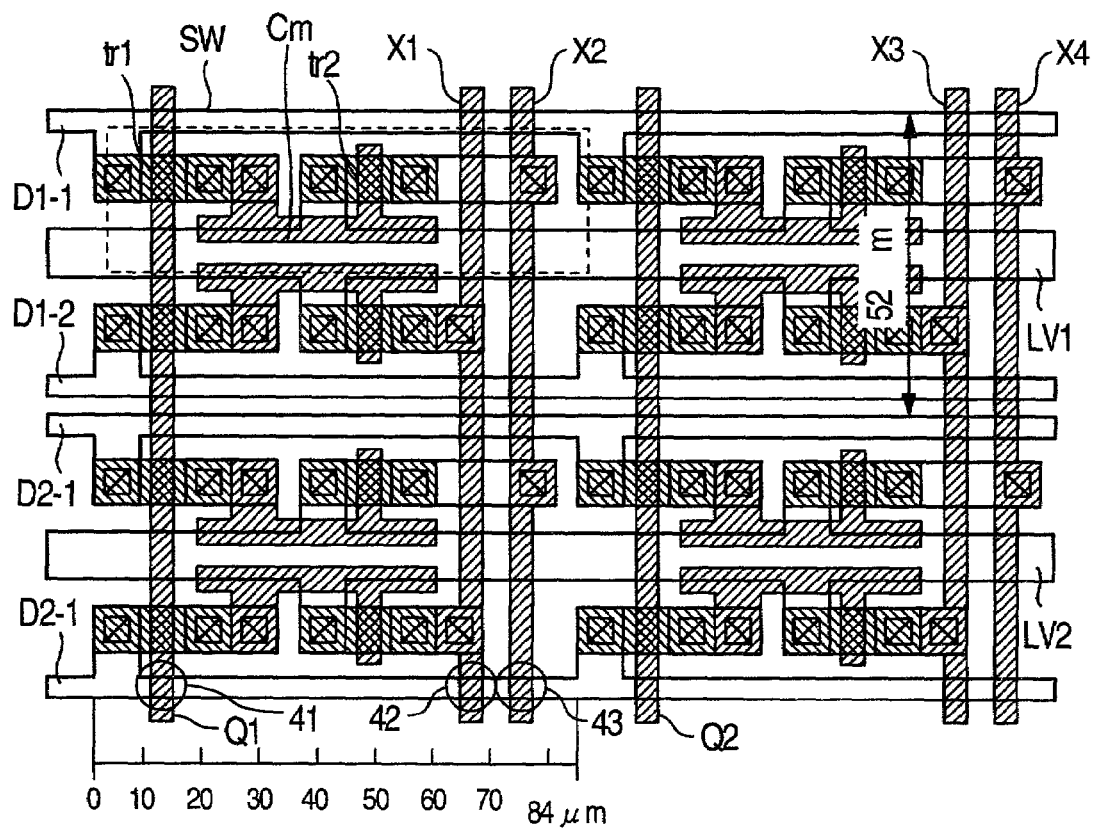
FIG. 20 is a diagram showing the circuit layout of a DA converter in an image display apparatus according to the present invention.
Figure 20:
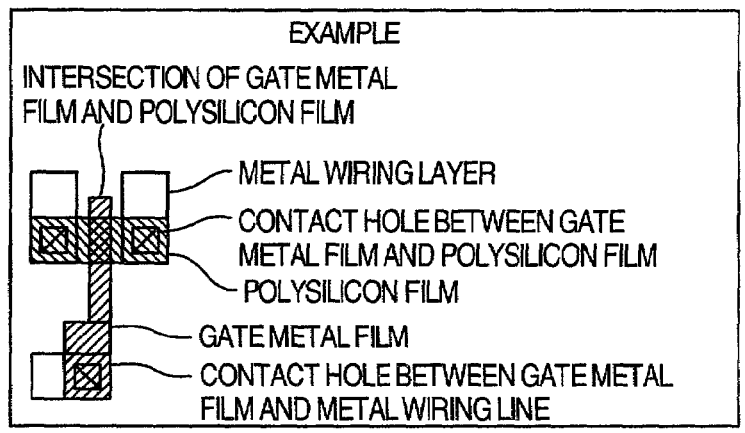

FIG. 20 shows an example of the circuit layout of the DA converter 4. This example illustrates only the region including two switch circuits SW in the lateral direction, and four switch circuits SW in the longitudinal direction with respect to the drawing sheet. The gradation voltage lines LV1 and LV2, and the switch drive lines D1-1, D1-2, D2-1 and D2-2 are the metal wiring lines formed as the same layer to run in the lateral direction with respect to the drawing sheet. The switch drive lines transmit the fast signals, and the gradation voltage lines are grounded on the AC basis. However, since the length of the wiring line is required to be long in the lateral direction, the switch drive lines and the gradation voltage lines that are formed in the lateral direction are made of preferably aluminum or copper in order to reduce their resistance. The trigger lines Q1 and Q2 and the output lines X1–X4 are made of the metal wiring lines formed as the same layer as the metal wiring lines forming the gates of the TFTs, and are formed in the longitudinal direction to intersect the gradation voltage lines and the switch drive lines. The switch circuits SW are formed in each of the spaces between the switch drive line D1-1 and the gradation voltage line LV1, between the gradation voltage line LV1 and the switch drive line D1-2, between the switch drive line D2-1 and the gradation voltage line LV2, and between the gradation voltage line LV2 and the switch drive line D2-2. In each of the switch circuits SW, two n-channel TFTs tr1 and tr2 are formed, and are connected by the metal wiring lines and the gate metal film according to the circuit diagram shown in FIG. 4. The TFTs tr1 and tr2 are formed at the intersections of the polysilicon film and the gate metal film. The polysilicon film in the regions other than the intersections with the gate metal film has phosphorus doped to form the n-channel TFT. The condenser Cm is formed in the region in which the metal wiring lines for the gradation voltage lines, and the gate metal film (the electrode formed as the wiring layer different from the gradation voltage lines) are overlapped.

The layout rule of the metal wiring lines is 4-µm space and 4-µm line width. The pitch of the switch circuits SW in the lateral direction with respect to the drawing sheet is 84 µm. Since one pitch of the switch circuits SW corresponds to two pixels, the pitch of the pixels is half that, or 42 µm. Thus, the image display apparatus can be constructed to have the high definition of 200 pixels/inch or more. In other words, the increase of the gradation number will result in the increase of the numbers of the switch circuits SW, the gradation voltage lines and the switch drive lines. However, according to this embodiment, the numbers of the output lines and the trigger lines does not increase due to the increase of the gradation number, so that this pitch is not affected by the increase of the gradation bit number.

According to this embodiment, even when the image display apparatus is of the multi-tone display type, the number of the wiring lines in the longitudinal direction with respect to the drawing sheet is always 1.5 per signal line irrespective of the gradation number. That is, the wiring lines in the longitudinal direction are three lines (i.e., the output lines X1 and X2 and the trigger line Q1) relative to two signal lines S1 and S2, so that the number thereof is 1.5 wiring lines per signal line. Thus, the space for the wiring is only (4+4)×1.5=12 µm when the layout rule is, for example, 4-µm space and 4-µm line width, and hence even the image display apparatus of 200 pixels/inch can have the circuit forming space of 30 µm per line. Therefore, the image display apparatus can be constructed to have the high definition of over 200 pixels/inch based on the vertical color stripe pixels.

In addition, even when the gradation bit number is "6", the number of the transistors of the DA converter 4 per signal line can be made as small as 2×64=125. The width of the DA converter 4 in the longitudinal direction with respect to the drawing sheet is 52 µm×64=3.584 mm, and thus the area to be occupied by the non-display region of the image display apparatus can be reduced.

Each switch drive line has three intersections 41–43 shown in FIG. 20 with the longitudinal lines including two signal lines, or 1.5 intersections occur per signal line. That is, the wiring lines that intersect are only two output lines and one trigger line. In addition, since two switch drive lines are provided in parallel on both sides of each gradation voltage line, the switch drive lines never intersect each other. Therefore, the number of the intersections between the wiring lines is constant irrespective of the increase of the gradation number n. Accordingly, even though the image display apparatus display is of the multi-tone display type, the number of the intersections (i.e., the intersection capacitance) can be reduced, so that it is possible to reduce the power consumption due to the transmission of the fast signals on the switch drive lines.

Moreover, according to this embodiment, the number of the state changes in n switch drive lines connected to each of the decoders 11 and 12 is maximum "2", and 2×(1−(1/n)) in average. Here, 1/n indicates the probability at which the same data occurs.

According to this embodiment, the maximum change of the gradation bit number is two or more, and the average bit value is four or more, thus the number of the changes being small. In other words, since each of the decoders 11 and 12 produces the signal of "1" on the single switch drive line alone, the number of the data change times can be reduced.

Therefore, as compared with the conventional system in which the multi-tone data is inputted as the binary data via the data bus, this embodiment can reduce the power consumption to the maximum value of 2 bits or more or to the average value of 4 bits or more. Accordingly, even when the multi-tone images are displayed, the power consumption can be reduced.

In addition, according to this embodiment, when the decoder 3 is constituted as the external IC 23 as shown in FIG. 7, it is similarly possible to reduce the power consumption caused when the parasitic capacitance of the flexible cable, via which the external IC 23 and the image display apparatus are connected, is driven. Accordingly, it is possible to reduce the power consumption due to the transmission of the fast signals on the external wiring line such as a flexible cable 24.

Figure 21:
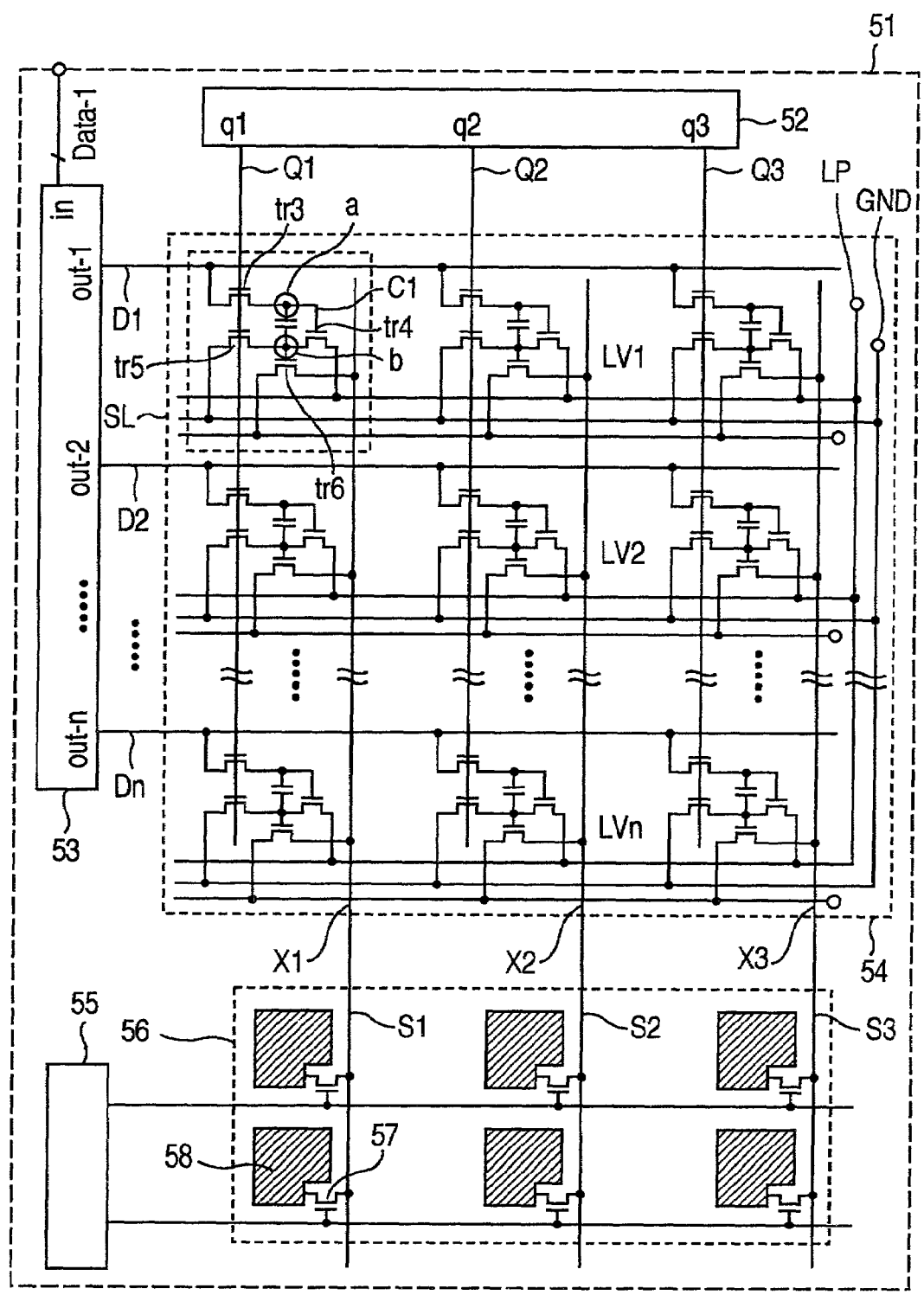
FIG. 21 is a diagram showing the construction of a main part of the second embodiment of an image display apparatus according to the present invention.

The second embodiment of the present invention will be described with reference to FIG. 21. In this embodiment, a DA converter 54 in place of the DA converter 4, and a decoder 53 in place of the decoder 3 are provided in the non-display region of an insulating substrate 51. The constructions of the other portions are the same as in FIG. 1. In FIG. 21, only the arrangement concerned with the signal lines S1–S3 is shown.

The decoder 53 is constructed to produce data of "1" (switch drive signal) on one of n switch drive lines D1–Dn and data of "0" on the other switch drive lines, when the multi-tone image data is inputted on a data line Data.

The DA converter 54 has n gradation voltage lines LV1–LVn, n switch drive lines D1–Dn, trigger lines Q1–Q3, output lines X1–X3, ground lines GND, and pulse lines LP. The ground line GND, the pulse line LP, and the gradation voltage lines LV1–LVn are provided in parallel with the respective switch drive lines. The trigger lines Q1–Q3 and the output lines X1–X3 are arranged in parallel with each other in the direction in such a manner that these lines intersect the above-mentioned lateral lines. In addition, switch circuits SL are formed in the regions near the intersections of those lines.

The switch drive lines D1–Dn are connected to the output ends of the decoder 53, the trigger lines Q1–Q3 are connected to the output ends of the shift register 2, and the output lines X1–X3 are connected to the signal lines S1–S3.

The switch drive lines and the gradation voltage lines are arranged such that under the condition of the arbitrary natural number i≦n, the switch drive line Di is in parallel with the i-th gradation voltage line LVi. The different voltages V1–Vn are applied to the gradation voltage lines LV1–LVn as the gradation voltages which correspond to the display gradations, like the above-mentioned embodiment. The low voltage corresponding to data of "0" are applied to the ground lines GND, and the pulses necessary for the level shift operation in the switch circuits LS are applied to the pulse lines LP.

The switch circuit SL includes n-channel TFTs tr3–tr6, and a condenser (electrostatic capacity) C1. This switch circuit SL has a function to serve as switching means for selecting a specified gradation voltage line in response to the trigger signal and data (switch drive signal) from the switch drive line, and also a function to serve as a level shifter (voltage level conversion means) for amplifying the voltage on the switch drive line. The gate electrodes of the TFTs tr3 and tr5 are connected to the trigger line Q1. When the trigger pulse (trigger signal) is fed via the trigger line Q1, those TFTs sample the voltages on the switch drive line D1 and the ground line GND in synchronism with this trigger pulse so that those voltages can be applied to the ends a and b of the condenser C1, respectively. The opposite ends of the condenser C1 are connected to the gate and drain electrodes of the TFT tr4, respectively. The voltage at the end b of the condenser C1 is shifted in level by the pulse on the pulse line LP.

The source and drain electrodes of the TFT tr6 are connected to the gradation voltage line LV1 and the output line X1, respectively. The TFT tr6 can serve as a switch that is controlled in its ON/OFF state by the voltage at the end b of the condenser C1 so as to connect or disconnect the gradation voltage line LV1 and the output line X1. In other words, the TFT tr6 is turned ON (conductive) when the high voltage is applied to the end b, and OFF (nonconductive) when the low voltage is applied thereto. The switch circuits SL arranged in a matrix shape at all the intersections of the output lines X1–X3 and the switch drive lines D1–Dn are similarly constructed as above.

Figure 22:
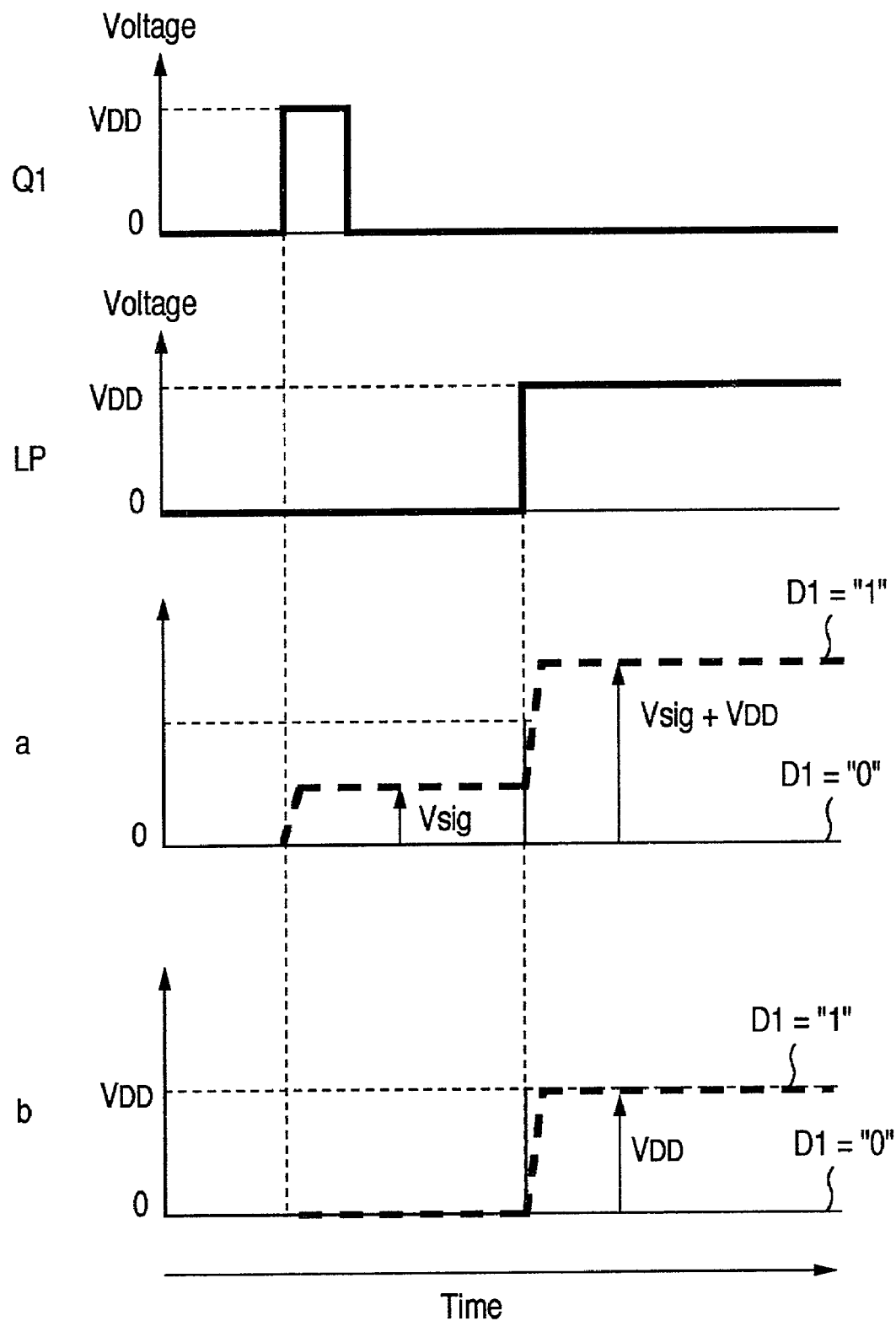
FIG. 22 is a diagram for explaining the level conversion operation of a switch circuit used in the apparatus shown in FIG. 21.

The level shift operation in the switch circuit SL will be described with reference to FIG. 22. First, when the pulse of voltage VDD is applied on the trigger line Q1 connected to the switch circuit SL, the voltage produced by sampling the switch drive line D1 appears at the point a, and the voltage of 0 V produced by sampling the ground line GND appears at the point b, as described above. The logic on the switch drive line is "1" or "0", and the voltage of "1" is the voltage Vsig that is smaller than VDD but larger than at least the threshold voltage of the TFT tr3. This voltage Ssig is usually smaller than 3 V. Therefore, when the voltage on the switch drive line is "1", the voltage on the switch drive line is sampled so that the voltage at the point a is Vsig. When the voltage on the switch drive line is "0", the voltage on the switch drive line is sampled so that the voltage at the point a is 0 V. After the completion of sampling, the pulse of voltage VDD is applied on the pulse line LP. Here, when the voltage at the point a is Vsig, the TFT tr4 is turned ON, and thus the voltage at the point b increases. The voltage at the point a is also risen through the condenser C1, and further the increase of the voltage at the point b is accelerated. Then, finally the voltage at the point b is stabilized to be VDD, and the voltage at the point a to be Vsig+VDD. When the voltage at the point a is 0 V, the TFT tr4 is-turned OFF, and thus the voltage at the point b remains 0 V.

By the above operations, the switch circuit SL can convert the voltage of amplitude Vsig on the switch drive line into the signal of amplitude VDD. Thus, when the voltage VDD is high, the TFT tr6 can be switched ON/OFF to control the wider range of the voltage on the gradation voltage line.

Figure 23:
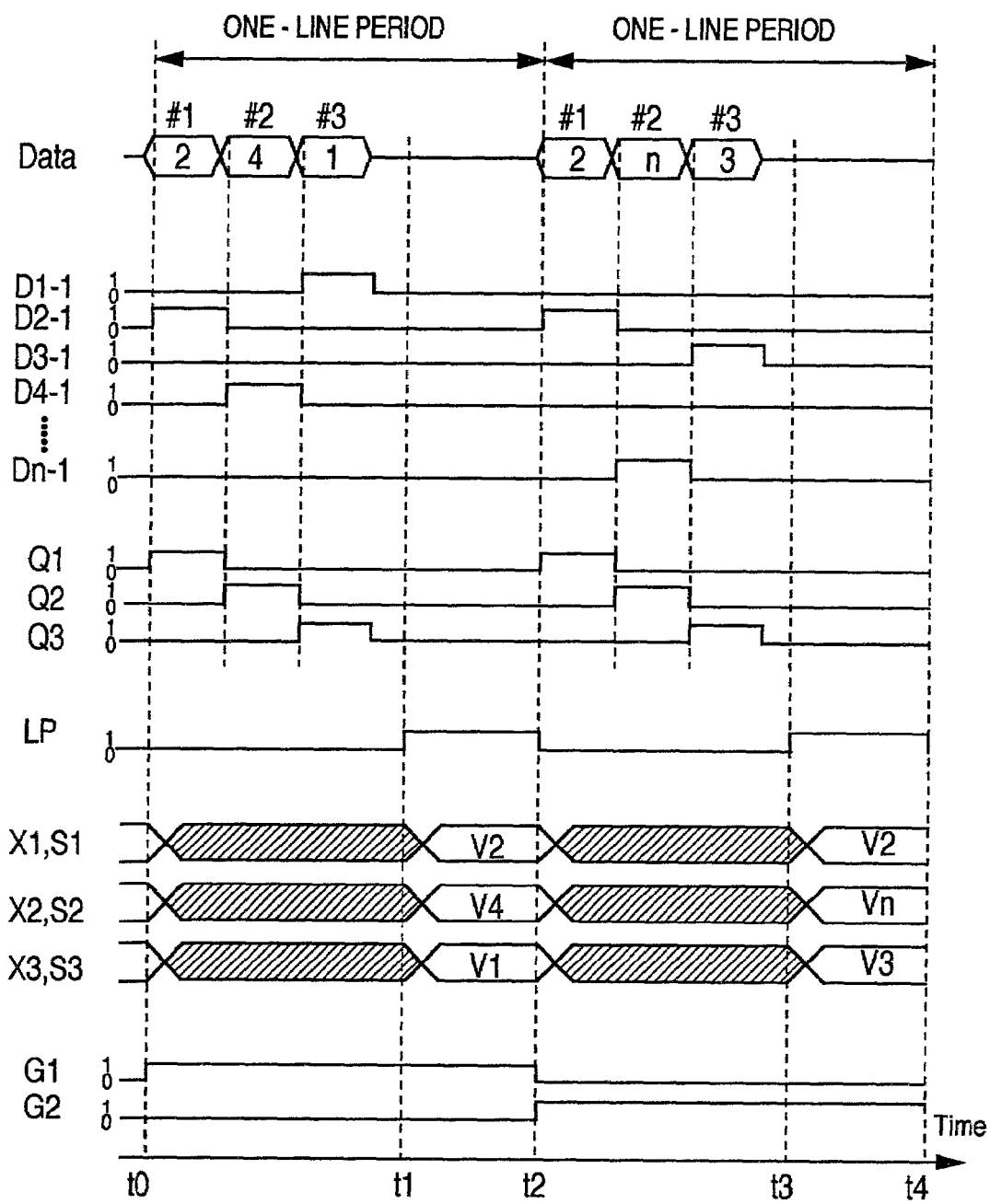
FIG. 23 is a time chart for explaining the operation of the apparatus shown in FIG. 21.

When the image is displayed, the circuits of the image display apparatus operate as shown in FIG. 23. When the multi-tone image data is fed to the input data line Data of the decoder 53 in the order of, for example, [2, 4, 1] as the lateral row of the image data #1–#3 to be displayed from left to right, the image data fed to the data line Data is decoded by the decoder 53. Then, according to the logic of the decoding, the signal of "1" is produced on one of the switch drive lines D1–Dn, and the signal of "0" on the other switch drive lines. When the shift register 2 sequentially produces the trigger pulses on the trigger lines Q1–Q3 in synchronism with the inputting of this image data, the TFTs tr3 and the TFTs tr5 connected to the trigger lines Q1–Q3 are turned ON. Of the switch circuits SL, data of "1" is stored in the switch circuits SL connected to the switch drive line on which data of "1" is produced, and data of "0" is stored in the other switch circuits SL. These data are held until they are again sampled. During this period, the TFTs tr6 of the switch circuits SL in which data of "1" is stored are turned ON. As a result, of the gradation voltage lines V1–Vn, the gradation voltage from one gradation voltage line connected to the switch circuits SL in which data of "1" is stored is supplied to the output lines.

When the pulse is fed on the pulse line LP after time t1 at which the generation of the trigger pulses fed on the trigger lines Q1–Q3 is completed, the switch circuit SL in which data of "1" is stored performs the level shift operation as described above. As a result, the gradation voltages are generated on all the output lines X1–X3. Therefore, the gradation voltages [V2, V4, V1] corresponding to the image data [2, 4, 1] are supplied to all the signal lines S1–S3, respectively.

In the process in which the gradation voltages are supplied to the signal lines S1–S3, the scanning lines G1 and G2 are alternately supplied thereon with the scanning pulse from the scanning circuit 5 at every line periods. Each of the time periods t0–t2 and t2–t4 is one-line period. The scanning line G1 is "1" during one line period of time t0–t2, and then the scanning line G2 is "1" during one-line period of time t2–t4. When the scanning line G1 is "1", the pixel TFTs 57 connected to the scanning line G1 have theirs source-drain paths made conductive, so that the gradation voltages from the signal lines S1–S3 are written in the first row of pixels 58 by time t2 at the latest.

Similarly, during one-line period of time t2–t4, the gradation voltages [V2, Vn, V3] corresponding to the image data [2, n, 3] are supplied to all the signal lines S1–S3 in the time period t3–t4, and the gradation voltages from the signal lines S1–S3 are written in the second row of the pixels 58 by time t4 at the latest. By the repetition of the above operations, it is possible to apply the aimed voltages to all the pixels 58 in the display region 56, thus displaying the image.

When the image display apparatus according to this embodiment is driven, the drive frequency of the decoder 53 is the same as the frequency of the image data inputted via the data line Data. The switch circuits SL are once driven by the trigger pulses from the trigger lines during one line period. In addition, since at least two data are inputted during one line period, the drive frequency of the decoder 53 is twice that of the switch circuits SL or more.

When the image display apparatus according to this embodiment is used as the liquid crystal display apparatus, the AC voltage with the polarities inverted every field is applied to each of the pixels 58. The light transmission factor of the liquid crystal can be changed by applying the root mean square value of this AC voltage to the liquid crystal. For this AC mode, the same method as in the first embodiment can be employed.

Figure 24:
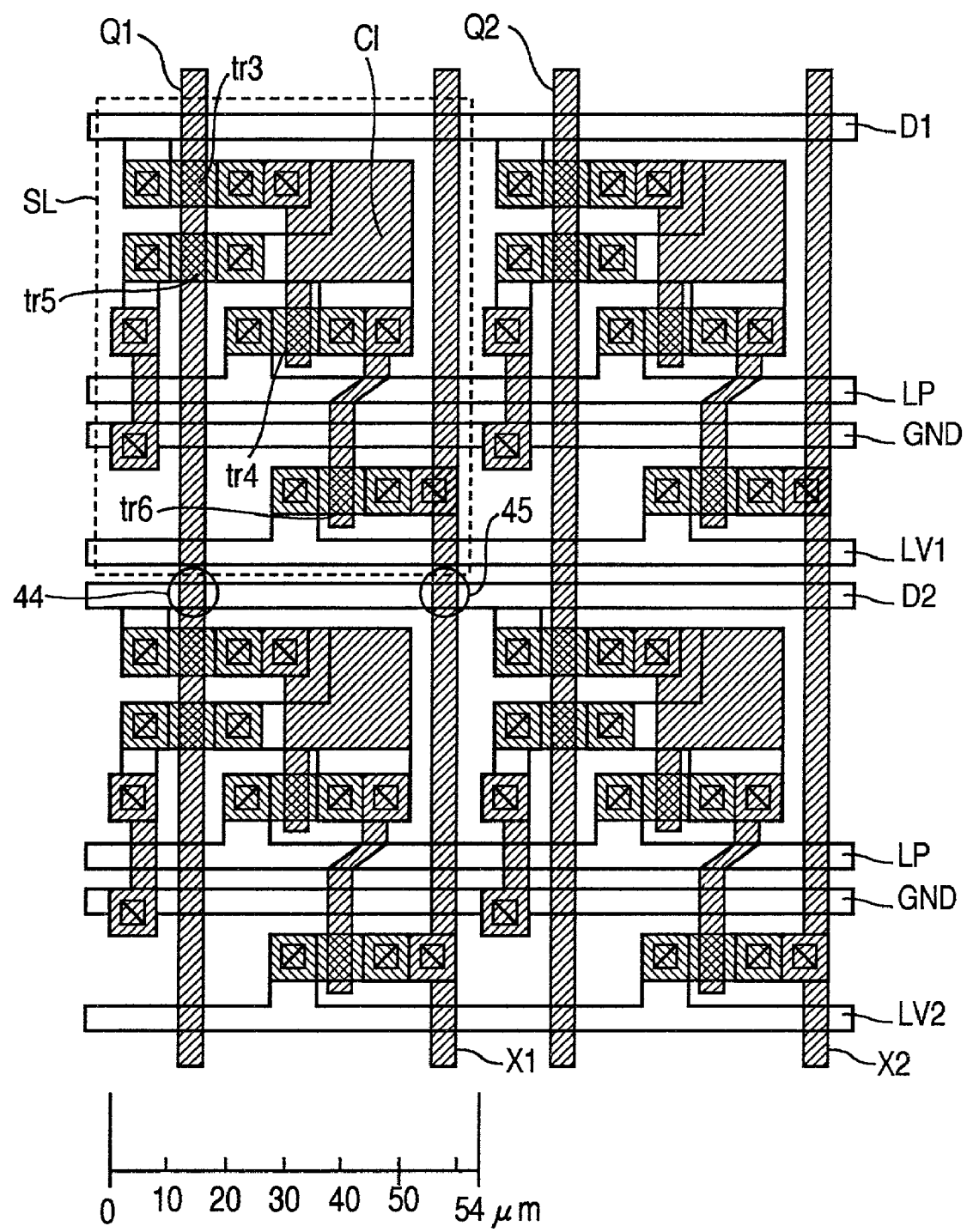
FIG. 24 is a diagram for explaining the circuit layout of the DA converter in the apparatus shown in FIG. 21.

FIG. 24 shows an example of the circuit layout of the DA converter 54 in this embodiment. This example illustrates only the region including two switch circuits SL in the lateral direction and two switch circuits in the longitudinal direction with respect to the drawing sheet. The gradation voltage lines LV1 and LV2, the switch drive lines D1 and D2, the ground lines GND, and the pulse lines LP are made of the metal wiring lines as the same layer, and are formed in the lateral direction. The fast signals are transmitted on the switch drive lines, and the gradation voltage lines are grounded on the AC basis. Since the wiring lines are necessary to be long in the lateral direction with respect to the drawing sheet, the wiring lines in the lateral direction are made of preferably aluminum or copper in order to have low resistance. The trigger lines Q1 and Q2 and the output lines X1 and X2 are made of the metal wiring lines formed as the same layer as those forming the gates of the TFTs, and are arranged in the longitudinal direction to intersect the gradation voltage lines and the switch drive lines. The switch circuits SL are formed in each of the spaces between the switch drive line D1 and the gradation voltage line LV1, and between the switch drive line D2 and the gradation voltage line LV2.

The switch circuit SL includes four n-channel TFTs tr3–tr6, and is connected by using the metal wiring lines and the gate metal film according to the circuit diagram shown in FIG. 21. The TFT tri1 and the TFT tr2 are formed at the intersections of the polysilicon film and the gate metal film. The polysilicon film formed in the regions other than the vicinities of the intersections with the gate metal film is doped with phosphorus to form the n-channel TFTs. The condenser C1 is formed at the overlap region of the metal wiring lines and the gate metal film.

The layout rule of the metal wiring line is 4-μm spacing and 4-μm line width. The pitch of the switch circuits SL in the lateral direction with respect to the drawing sheet is 64 pm. Therefore, the image display apparatus as shown in the example of the circuit layout can be constructed to have the high definition of about 130 pixels/inch based on the pixels of the vertical color stripes. In this case, the numbers of the switch circuits SL, the gradation voltage lines and the switch drive lines increase with the increase of the gradation number, but the numbers of the output lines and the trigger lines do not increase. Thus, this pitch is not affected by the increase of the gradation bit number.

In other words, even when the multi-tone image is displayed, the number of the wiring lines in the longitudinal direction with respect to the drawing sheet is always "2" per signal line irrespective of the gradation number. Thus, the space necessary for the wiring lines is (4+4)×2=16 μm in which is smaller than 42 μm, under the layout rule of 4-μm spacing and 4-μm line width, for example. Therefore, although the layout shown in FIG. 24 has the definition of about 130 pixels/inch, the definition can be increased to over 200 pixels/inch.

In addition, the number of the intersections of the switch drive lines in this embodiment is "2" per signal line, as shown at intersections 44 and 45 in FIG. 24. The wiring lines that intersect are two output lines and one trigger line. Moreover, since two switch drive lines are provided in parallel on both sides of each gradation voltage line, respectively, the switch drive lines never intersect each other.

Also, when the numbers of the power supply lines and the common signal lines such as the ground lines GND and the pulse lines LP are increased, those lines can be arranged in parallel with the switch drive lines. Thus, the number of the intersections of the switch drive lines are never increased. Therefore, the number of the lines intersected is unchanged even when the gradation number n is increased. Thus, even when the image display apparatus is of the multi-tone display type, the lines intersected, or the intersection line capacitance can be decreased. As a result, it is possible to reduce the power consumption on the switch drive lines on which the fast signals are transmitted.

Moreover, according to this embodiment, the number of the data change times on the n switch drive lines connected to one single decoder 53 is maximum "2", and 2×(1−(1/n)) in average. That is, in this embodiment, the maximum gradation bit number is two or more, and the average gradation bit number is four or more, thus the number of changes being small.

As compared with the conventional system in which the multi-tone image data is inputted as the binary data via the data bus, the maximum power consumption is 2 bits or more, and the average power consumption is 4 bits or more in this embodiment. Accordingly, it is possible to reduce the power consumption even when the multi-tone image is displayed.

In addition, when the decoder 53 is constructed as the external IC 23, the power consumption due to the drive of the parasitic capacitance of the flexible cable via which the external IC 23 and the image display apparatus are connected can be reduced. Accordingly, it is possible to reduce the power consumption of the fast signals on the external wiring line such as a flexible cable.

Moreover, according to this embodiment, since the logic voltage of "1" on the switch drive lines can be reduced to the threshold voltage of the TFT tr3, the amplitude of the signal voltage on the switch drive lines can be decreased. Thus, it is possible to reduce the power consumption on the switch drive lines.

Figure 25:
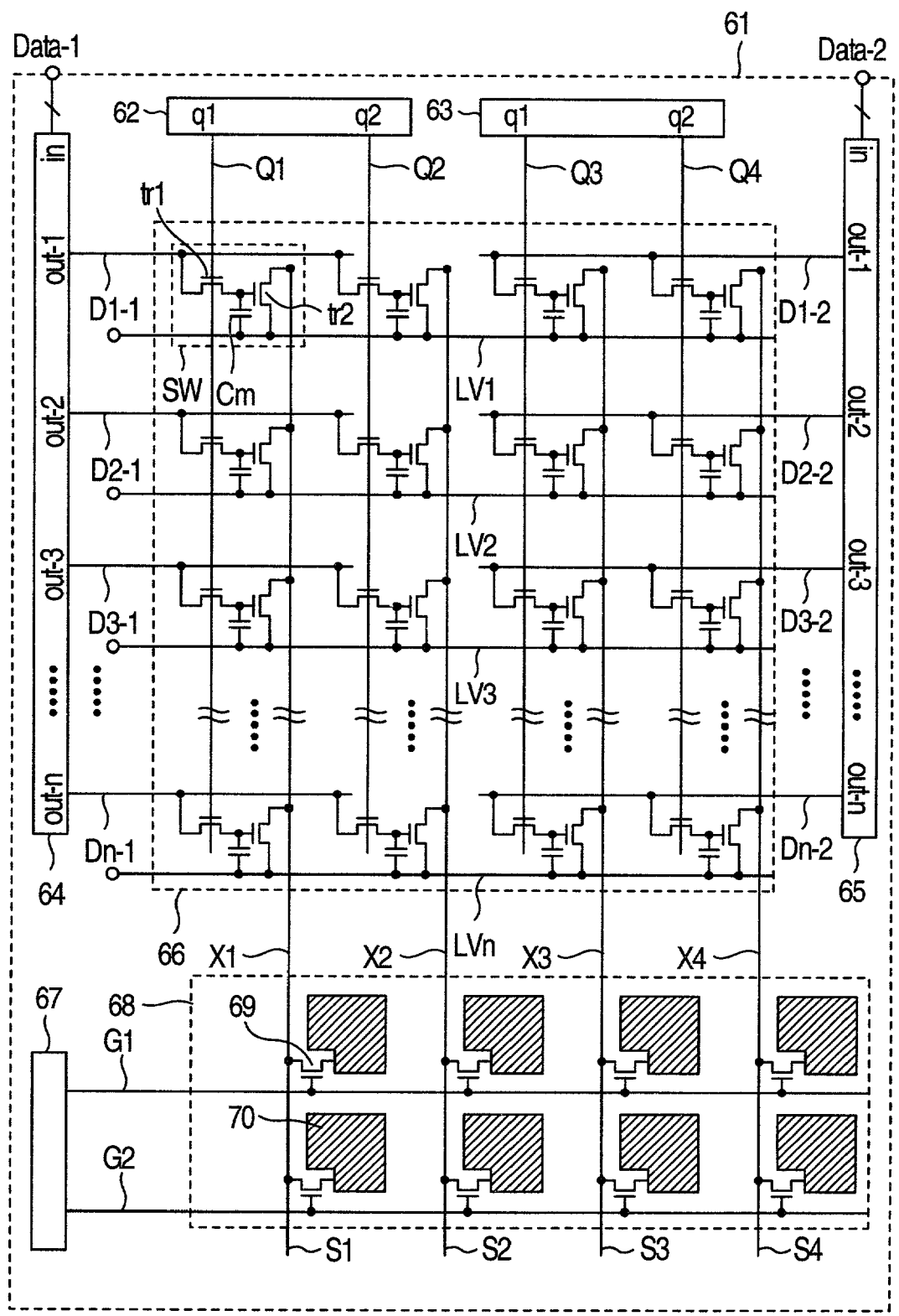
FIG. 25 is a diagram showing the construction of a main part of the third embodiment of an image display apparatus according to the present invention.

The third embodiment of the present invention will be described with reference to FIG. 25. In this embodiment, shift registers 62 and 63 in place of the shift register 2, decoders 64 and 65 in place of the decoder 3, and a DA converter 66 in place of the DA converter 4 are formed in the non-display region of an insulating substrate 61. The constructions of the other portions are the same as in FIG. 1. In this embodiment, only the arrangement concerned with the signal lines S1–S4 is described.

Each of the shift register 62 and 63 is constructed by using inverters, clocked inverters, and AND gates as in the first embodiment to sequentially produce the trigger pulses on the trigger lines Q1, Q2, Q3 and Q4 in synchronism with the image data input.

The decoders 64 and 65 have the same arrangements as the decoders 11 and 12 shown in FIG. 5, respectively. In response to the multi-tone image data, data of "1" is produced on one of the switch drive lines D1-1 to Dn-1 or D1-2 to Dn-2, and data of "0" is produced on the other switch drive lines. The decoders 64 and 65 are disposed to oppose each other with the DA converter 66 interposed between them. Each of the decoder 64 and 65 may be constructed as the external IC 23 as shown in FIG. 7.

The DA converter 66 has n gradation voltage lines LV1–LVn, 2×n switch drive lines D1-1 to Dn-1 and D1-2 to Dn-2, trigger lines Q1–Q4, and output lines X1–X4. The switch drive lines D1-1 to Dn-1 are connected to the output ends of the decoder 64. The switch drive lines D1-2 to Dn-2 are connected to the output ends of the decoder 65. The trigger lines Q1–Q4 are connected to the output ends of the shift registers 62 and 63. The output lines X1–X4 are connected to the signal lines S1–S4.

The switch drive lines D1-1 to Dn-1 and D1-2 to Dn-2 are arranged in parallel with the gradation voltage lines LV1–LVn. The trigger lines Q1–Q4 and the output lines X1–X4 are arranged to intersect the switch drive lines D1-1 to Dn-1 and D1-2 to Dn-2. The switch circuits SW are formed in the regions near the intersections of the wiring lines. The different voltages V1–Vn are applied on the gradation voltage lines LV1–LVn as the gradation voltages corresponding to the display gradations.

The switch circuit SW is constructed of the n-channel TFTs tr1 and tr2, and the condenser Cm, like the first embodiment. However, the switch circuits SW connected to the output lines X1 and X2 are connected to the switch drive lines D1-1 to Dn-1. The switch circuits SW connected to the output lines X3 and X4 are connected to the switch drive lines D1-2 to Dn-2.

In this embodiment, the switch drive lines are divided into two separate regions, but the gradation voltage lines are used common to the two regions. Therefore, the image can be prevented from being irregular due to the very small differences between the gradation voltages. The switch drive lines may be divided into more than two regions.

Figure 26:
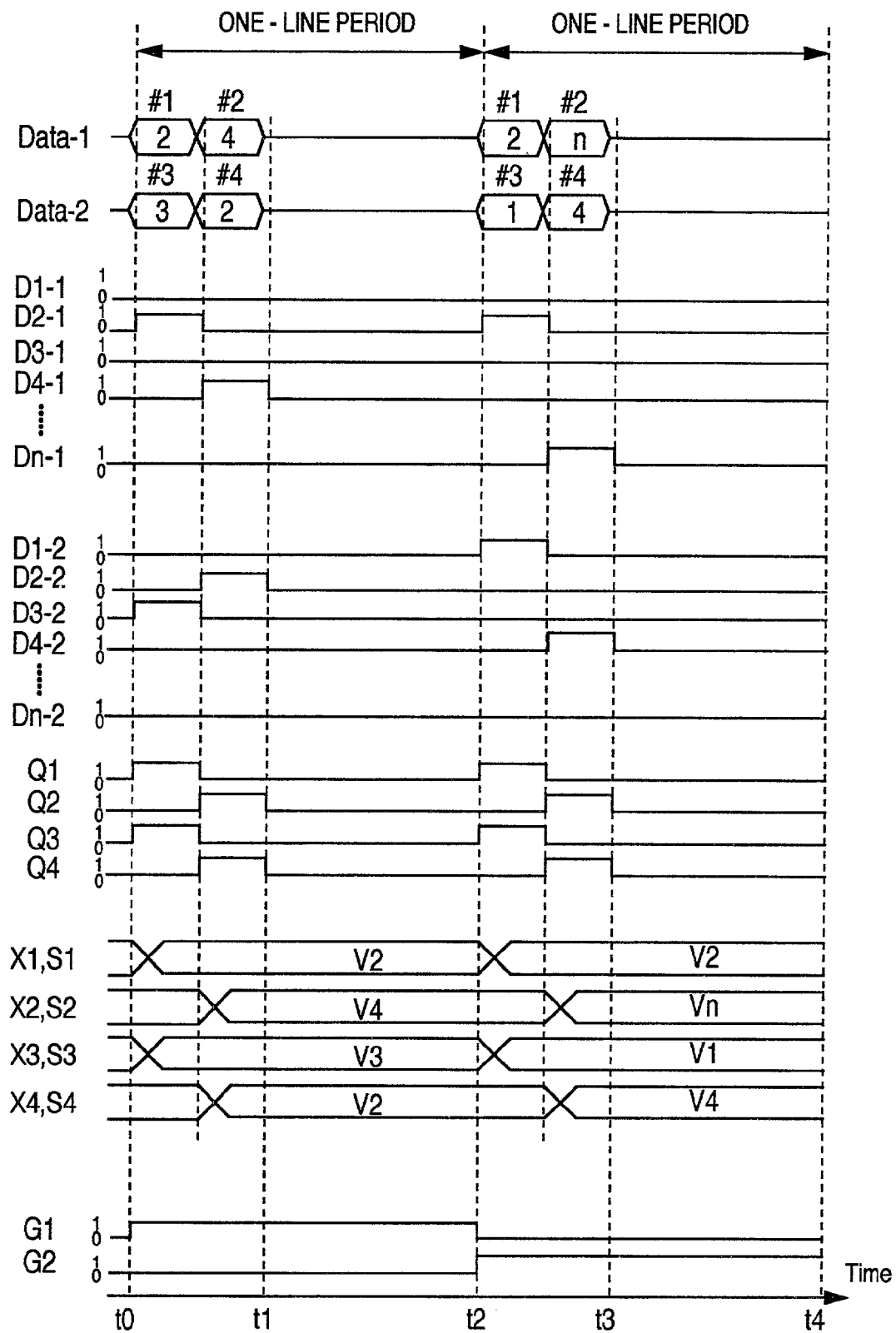
FIG. 26 is a time chart for explaining the operation of the apparatus shown in FIG. 25.

The circuits of the image display apparatus are operated as shown in FIG. 26 to display the image on the display region 68. As the multi-tone image data, the left and right halves of the image are fed to the input end of the decoders 64 and 65 via the data lines Data-1 and Data-2, respectively. When the image data #1–#4 of the first row to be displayed are [2, 4, 3, 2] from left to right in turn, image data of [2, 4] and image data of [3, 2] are fed via the data lines Data-1 and Data-2, respectively. These data are decoded by the decoders 64 and 65, respectively. According to the logic of the decoding, one of the switch drive lines D1-1 to Dn-1 and one of the switch drive lines D1-2 to Dn-2 are turned "1", and the other lines are turned "0".

At this time, the trigger pulses are supplied from the shift registers 62 and 63 to the trigger lines Q1 and Q2 and the trigger lines Q3 and Q4 in synchronism with the inputting of the image data. When the trigger pulses are sequentially fed to the trigger lines, data of "1" is stored in the switch circuits SW connected to the switch drive lines of "1", of the switch circuits SW to which the trigger pulses are applied. On the other hand, data of "0" is stored in all of the other switch circuits connected to the switch drive lines of "0". These stored data are held until they are again sampled. During this interval, the TFTs tr2 of the switch circuits SW in which "1"

is stored are turned ON. As a result, the gradation voltages on the gradation voltage lines connected to the switch circuits SW in which "1" is stored, of the gradation voltage lines LV1–LVn, are supplied to the corresponding output lines.

In other words, the gradation voltages are sequentially fed to the output lines X1–X4 according to the trigger pulses generated from time t0, and are supplied to the signal lines S1–S4. At time t1 at which the final trigger pulses are fed to the trigger lines Q2 and Q4 and the generation of the trigger pulses ends, the gradation voltages [V2, V4, V3, V2] corresponding to the image data [2, 4, 3, 2] are fed to all the signal lines S1–S4.

In the process in which the gradation voltages are fed to the signal lines, the scanning pulses are sequentially produced from the scanning circuit 67 to the scanning lines G1 and G2 every line period. One-line period is each of the time periods t0–t2 and t2–t4. The scanning line G1 becomes "1" during one-line period from time t0 to time t2, and the scanning line G2 is turned "1" during one-line period from time t2 to time t4. When the scanning line G1 is "1", one row of the pixel TFTs 69 connected to the scanning line G1 have their source-drain paths made conductive. As a result, the gradation voltages from the signal lines S1–S4 are written in the row of the pixels 70 during the time period t1–t2 at the latest.

Similarly, during the time period t2–t4, the gradation voltages [V2, Vn, V1, V4] corresponding to the image data [2, n, 1, 4] are supplied to all the signal lines S1–S4 by time t3. Further, the gradation voltages on the signal lines S1–S4 are written in the second row of the pixels 70 during the time period t3–t4 at the latest. By the repetition of the above operations, it is possible to apply the aimed voltages to the pixels 70 of all the display region 68 and to display the image.

When the image display apparatus according to this embodiment is driven, the frequency of the decoders 64 and 65 is the same as that of the image data fed via the data lines Data-1 and Data-2. The switch circuits SW are driven by the trigger pulses from the trigger lines once per line period. Therefore, since at least two data are fed in each line period, the drive frequency of the decoders 64 and 65 is twice that of the switch circuits SW, or more.

When the image display apparatus according to this embodiment is used as the liquid crystal display apparatus, the AC voltages with the polarities inverted every field are applied to the pixels 70, and-the root means square values of the AC voltages are applied to drive the liquid crystal. Thereby, the light transmission factor of the liquid crystal is changed. The method of the AC application may be the same as that in the first embodiment.

Figure 27:
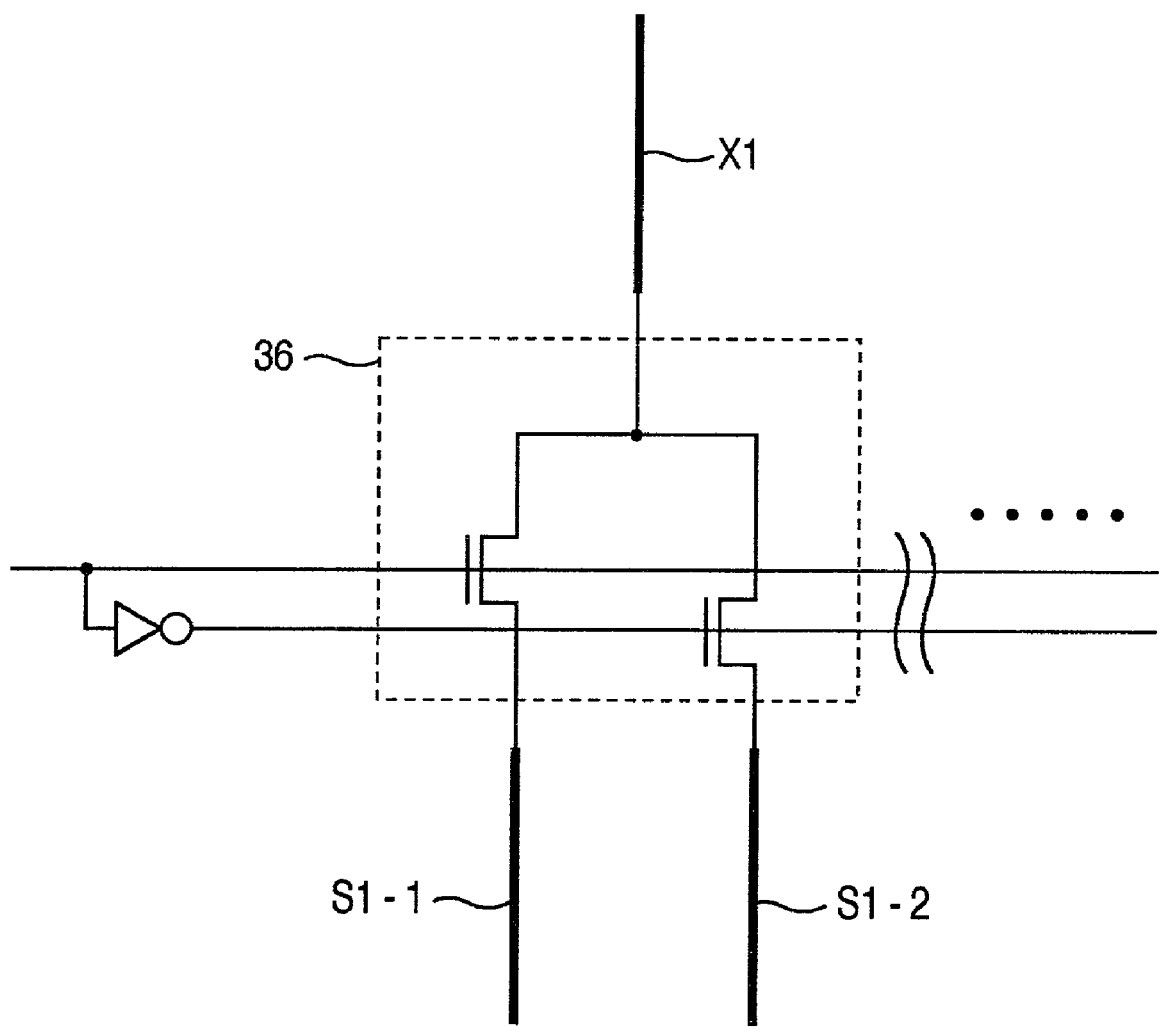
FIG. 27 is a circuit diagram showing a distribution circuit in an image display apparatus according to the present invention.

In addition, according to this embodiment, the output line X1 is directly coupled to the signal line S1. However, a distribution circuit 36 may be provided as means for distributing the voltage on the single output line to two signal lines S1-1 and S1-2 as shown in FIG. 27. The voltage on the output line X2 can also be distributed similarly. By employing such circuit arrangement, it is possible to reduce the number of the circuit elements of the DA converter 66. However, since the operation in one-line period as shown in FIG. 26 must be made twice in one-line period, the circuit operation is performed with twice the speed as high. The voltage on the single output line may be distributed to two or more signal lines.

According to this embodiment, even if the image display apparatus is of the multi-tone display type, two wiring lines in the longitudinal direction with respect to the drawing sheet are always used per signal line irrespective of the number of the gradations. Thus, when the layout rule is 4-µm spacing and 4-µm line width, the space necessary for the wiring is only (4+4)×2=16 µm in width, which is smaller than 42 µm, for example. Therefore, this embodiment can display the image with the high definition over 200 pixels/inch.

Moreover, the number of the intersections of the switch drive lines in this embodiment is two per signal line, like in the second embodiment. The intersection wiring lines are two output lines and one trigger line only. Since two switch drive lines are provided in parallel on both sides of the gradation voltage line, the switch drive lines never intersect each other. Therefore, the number of the intersection wiring lines is constant irrespective of the increase of the gradation number n. Thus, even when the image display apparatus is of the multi-tone display type, the intersection lines (i.e., the intersection wiring capacitance) becomes small, so that it is possible to reduce the power consumption on the switch drive lines on which the fast signals are transmitted.

In addition, according to this embodiment, the number of the data changes (the number of the state changes) on n switch drive lines connected to each of the decoder 64 and 65 is maximum "2", and the average value thereof is $2\times(1-(1/n))$. In other words, according to this embodiment, the maximum gradation bit number is two or more, and the average gradation bit number is four or more. Thus, it is possible to reduce the number of the changes.

Therefore, as compared with the conventional system in which the multi-tone data is inputted as the binary data via the data bus, the maximum power consumption is 2 bits or more and the average power consumption is 4 bits or more according to this embodiment. Therefore, it is possible to reduce the power consumption even in the image display apparatus which displays the multi-tone image.

Also, when the decoders 64 and 65 are constructed as the external IC 23, the power consumed when the parasitic capacitance of the flexible cable connecting the external IC and the image display apparatus is driven can also be reduced. Thus, it is possible to reduce the power consumption when the fast signal is transmitted on the external line such as a flexible cable.

What is claimed is:

1. An image display apparatus comprising:
    image display means including a pixel in a region near an intersection at which each of signal lines and each of scanning lines are intersected with each other, said signal lines and said scanning lines being arranged in a matrix, and said pixel being connected to said signal line and said scanning line via a switch element;
    a group of gradation voltage lines to provide analogue gradation voltages in accordance with display gradations;
    decoder means for producing switch drive signals by which any one of said gradation voltage lines is selected in accordance with digital high-gradation image data;
    trigger signal output means for sequentially producing trigger signals in accordance with said image data; and
    a plurality of switch means, coupled to receive said switch drive signals and said trigger signals, for selecting a specified gradation voltage line in response to said switch drive signals under condition in which said trigger signals are inputted to said switch means, to supply a gradation voltage from said specified gradation voltage line to a specified signal line;

wherein a plurality of switch drive lines for transmitting said switch drive signals are connected to said decoder means;

a plurality of trigger lines for transmitting said trigger signals are connected to said trigger signal output means;

output lines for transmitting said specified gradation voltage to said specified signal line are connected to said plurality of switch means; and said plurality of switch drive lines and said group of gradation voltage lines are arranged to intersect said plurality of trigger lines and said output lines.

2. An image display apparatus according to claim 1, wherein said group of gradation voltage lines are arranged in parallel along said plurality of switch drive lines.

3. An image display apparatus according to claim 1, wherein one of said switch drive lines is arranged in parallel with one gradation voltage line of said group of gradation voltage lines.

4. An image display apparatus according to claim 1, wherein two switch drive lines of said switch drive lines are arranged in parallel on both sides of one gradation voltage line of said group of gradation voltage lines.

5. An image display apparatus comprising:

image display means including a pixel in a region near an intersection at which each of signal lines and each of scanning lines are intersected with each other, said signal lines and said scanning lines being arranged in a matrix, and said pixel being connected to said signal line and said scanning line via a switch element;

a group of gradation voltage lines to provide analogue gradation voltages in accordance with display gradations;

decoder means for producing switch drive signals by which any one of said gradation voltage lines is selected in accordance with digital high-gradation image data;

trigger signal output means for sequentially producing trigger signals in accordance with said image data; and a plurality of switch means, coupled to receive said switch drive signals and said trigger signals, for selecting a specified gradation voltage line in response to said switch drive signals under condition in which said trigger signals are inputted to said switch means, to supply a gradation voltage from said specified gradation voltage line to a specified signal line;

wherein a plurality of switch drive lines for transmitting said switch drive signals are connected to said decoder means;

a plurality of trigger lines for transmitting said trigger signals are connected to said trigger signal output means;

output lines for transmitting said specified gradation voltage to said specified signal line are connected to said plurality of switch means; and said group of gradation voltage lines and said plurality of switch drive lines are formed as a same wiring layer.

6. An image display apparatus according to claim 5, wherein said group of gradation voltage lines and said plurality of switch drive lines are made of a wiring material of aluminum or copper.

7. An image display apparatus comprising:

image display means including a pixel in a region near an intersection at which each of signal lines and each of scanning lines are intersected with each other, said signal lines and said scanning lines being arranged in a matrix, and said pixel being connected to said signal line and said scanning line via a switch element;

a group of gradation voltage lines to provide analogue gradation voltages in accordance with display gradations;

decoder means for producing switch drive signals by which any one of said gradation voltage lines is selected in accordance with digital high-gradation image data;

trigger signal output means for sequentially producing trigger signals in accordance with said image data; and a plurality of switch means, coupled to receive said switch drive signals and said trigger signals, for selecting a specified gradation voltage line in response to said switch drive signals under condition in which said trigger signals are inputted to said switch means, to supply a gradation voltage from said specified gradation voltage line to a specified signal line;

each of said plurality of switch means includes:

a first thin film transistor which becomes conductive by being inputted said trigger signal to transmit said switch drive signal; and a second thin film transistor which becomes conductive by said switch drive signal produced from said first thin film transistor to transmit a gradation voltage to said output line.

8. An image display apparatus according to claim 7, wherein each of said plurality of switch means includes a condenser for holding said switch drive signal produced from said first thin film transistor.

9. An image display apparatus according to claim 8, wherein said condenser is an electrostatic capacity formed by overlapping any one gradation voltage line of said group of gradation voltage lines and an electrode formed in a wiring layer different from said group of gradation voltage lines.

10. An image display apparatus according to claim 7, wherein each of said plurality of switch means includes memory means for storing said switch drive signal produced from said first thin film transistor as at least one-bit information.

11. An image display apparatus according to claim 7, wherein said plurality of switch means are disposed in regions near intersections at which said switch drive lines and said trigger lines are intersected each other, respectively.

12. An image display apparatus according to claim 7, wherein said first thin film transistor and said second thin film transistor are formed using n-channel thin film transistors when the gradation voltage on said gradation voltage line is relatively smaller than a signal voltage on said switch drive line, and are formed using p-channel thin film transistors when the gradation voltage on said gradation voltage line is relatively higher than the signal voltage on said switch drive line.

13. An image display apparatus according to claim 7, wherein each of said plurality of switch means includes voltage level conversion means for amplifying said switch drive signal.

14. An image display apparatus according to claim 13, wherein wiring lines for supplying a particular voltage and a common signal to said voltage level conversion means are arranged in parallel in said group of gradation voltage lines.

15. An image display apparatus comprising:

image display means including a pixel in a region near an intersection at which each of signal lines and each of scanning lines are intersected with each other, said signal lines and said scanning lines being arranged in a matrix shape, and said pixel being connected to said signal line and said scanning line via an switch element;

a group of gradation voltage lines applied to provide analogue gradation voltages in accordance with display gradations;

decoder means for producing switch drive signals by which any one of said gradation voltage lines is selected in accordance with digital high-gradation image data;

trigger signal output means for sequentially producing trigger signals in accordance with said image data; and a plurality of switch means, coupled to receive said switch drive signals and said trigger signals, for selecting a specified gradation voltage line in response to said switch drive signals under condition in which said trigger signals are inputted to said switch means, to supply a gradation voltage from said specified gradation voltage line to a specified signal line;

wherein when said image display apparatus is driven, a drive frequency at which said switch drive signals are supplied from said decoder means to said plurality of switch drive lines is set to twice or more as high as a drive frequency at which said trigger signals are supplied from said signal output means.

16. A method according to claim 15, wherein a number of simultaneous data switching for a gradation data inputted to said decoder means is two or less; and said decoder means sequentially produces switch drive signals for selecting one single switch drive line in accordance with said gradation data.

* * * * *